US010529296B2

(12) United States Patent
Tsai et al.

(10) Patent No.: US 10,529,296 B2
(45) Date of Patent: Jan. 7, 2020

(54) SCANNING LINE DRIVE CIRCUIT AND DISPLAY DEVICE INCLUDING THE SAME

(71) Applicant: SHARP KABUSHIKI KAISHA, Sakai, Osaka (JP)

(72) Inventors: Yi-Cheng Tsai, Sakai (JP); Satoshi Horiuchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/184,795

(22) Filed: Nov. 8, 2018

(65) Prior Publication Data

US 2019/0147820 A1    May 16, 2019

(30) Foreign Application Priority Data

Nov. 14, 2017   (JP) ................. 2017-218854

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0283* (2013.01); *G09G 2310/06* (2013.01); *G09G 2310/08* (2013.01); *G09G 2320/0214* (2013.01)

(58) Field of Classification Search
CPC ....... G09G 2310/0283; G09G 2310/06; G09G 2310/08; G09G 2320/0214; G09G 3/3677; G11C 19/28

USPC ................................. 345/100, 208
See application file for complete search history.

(56) References Cited

U.S. PATENT DOCUMENTS

2011/0199354 A1    8/2011    Iwase et al.

FOREIGN PATENT DOCUMENTS

WO    2010/067641 A1    6/2010

*Primary Examiner* — Tony O Davis
(74) *Attorney, Agent, or Firm* — ScienBiziP, P.C.

(57) ABSTRACT

To a unit circuit, provided are a transistor to which a first clock signal is supplied, a transistor for applying an off-level voltage to a first node, a transistor for applying the off-level voltage to a second node, a transistor for applying an on-level voltage to the second node based on a clock signal being ahead of the first clock signal in a forward direction scanning, a transistor for applying the on-level voltage to the second node based on a clock signal being ahead of the first clock signal in a backward direction scanning, and a circuit for controlling a voltage of the first node based on output signals of the unit circuits in a front-side stage and a back-side stage. The unit circuit is configured so that a voltage of the second node is changed to an ON level and an OFF level while a voltage of the first node is in the OFF level and the voltage of the second node is in the ON level when the first clock signal is changed to the ON level while the voltage of the first node is in the OFF level.

20 Claims, 20 Drawing Sheets

SCANNING LINE DRIVE CIRCUIT AND DISPLAY DEVICE INCLUDING THE SAME

BACKGROUND OF THE INVENTION

Field of the Invention

The present invention relates to a scanning line drive circuit having a function of switching a selection order of scanning lines (hereinafter referred to as a scanning direction), and a display device including the same.

Description of Related Art

A liquid crystal display device is widely used as a thin, light-weight, and low-power consumption display device. The liquid crystal display device includes a liquid crystal panel having a plurality of scanning lines, a plurality of data lines, and a plurality of pixel circuits, a scanning line drive circuit, and a data line drive circuit. In some liquid crystal display devices, a technique (gate driver monolithic technique) in which the scanning line drive circuit is formed on the liquid crystal panel together with the pixel circuits is used in order to downsize the device.

The scanning line drive circuit has a configuration in which a plurality of unit circuits are connected in multi-stage. Many circuits are conventionally known as the unit circuit of the scanning line drive circuit. For example, International Publication No. 2010/67641 discloses a unit circuit 91 shown in FIG. 24. The unit circuit 91 includes ten thin film transistors (hereinafter referred to as TFTs) Q1 to Q10 and a capacitor C9. According to a scanning line drive circuit in which the unit circuits 91 are connected in multi-stage, even if a leakage current of the TFT is relatively large, unnecessary power consumption caused by the leakage current can be suppressed. Note that the scanning line drive circuit does not have a function of switching a scanning direction.

In order to prevent a malfunction of the scanning line drive circuit, some unit circuits include a stabilization circuit for stabilizing a voltage of a gate terminal of an output transistor. Furthermore, some scanning line drive circuits have a function of switching the scanning direction. However, if the unit circuit including the stabilization circuit and having the function of switching the scanning direction is designed without any special contrivance, it is necessary to increase a size of a specific TFT included in the stabilization circuit, and a size of the scanning line drive circuit is increased (see FIG. 9 and its description described later).

SUMMARY OF THE INVENTION

Therefore, providing a small-sized scanning line drive circuit having the function of switching the scanning direction and capable of preventing the malfunction is taken as a problem.

The above-described problem can be solved by a scanning line drive circuit configured by connecting a plurality of unit circuits in multi-stage, and having a function of switching a scanning direction, wherein the unit circuit includes: an output transistor having a first conduction terminal to which a first clock signal is supplied, a second conduction terminal connected to an output terminal, and a control terminal connected to a first node; a first transistor having a first conduction terminal connected to the first node, a second conduction terminal to which an off-level voltage is applied, and a control terminal connected to a second node; a second transistor having a first conduction terminal connected to the second node, a second conduction terminal to which the off-level voltage is applied, and a control terminal connected to the first node; a third transistor configured to apply an on-level voltage to the second node based on a second clock signal being ahead of the first clock signal in a forward direction scanning; a fourth transistor configured to apply the on-level voltage to the second node based on a third clock signal being ahead of the first clock signal in a backward direction scanning; and a first node control circuit configured to control a voltage of the first node based on an output signal of the unit circuit in a front-side stage and an output signal of the unit circuit in a back-side stage, a voltage of the second node is changed to an ON level and an OFF level while the voltage of the first node is in the OFF level, and the voltage of the second node is in the ON level when the first clock signal is changed to the ON level while the voltage of the first node is in the OFF level.

In the above-described scanning line drive circuit, the second clock signal becomes the ON level before the first clock signal in the forward direction scanning, and the third clock signal becomes the ON level before the first clock signal in the backward direction scanning. Thus, when the first clock signal is changed to the ON level, a voltage of the second node is already in the ON level and the first transistor is already in the ON state. Therefore, without increasing a size of the first transistor, even if a voltage of the first node is increased when the first clock signal is changed to the ON level, the voltage of the first node becomes the OFF level immediately. Therefore, it is possible to provide a small-sized scanning line drive circuit having a function of switching a scanning direction and capable of preventing a malfunction.

These and other objects, features, modes and effects of the present invention will be more apparent from the following detailed description with reference to the attached drawings.

DETAILED DESCRIPTION OF THE INVENTION

In the following, scanning line drive circuits according to embodiments and liquid crystal display devices including the same will be described with reference to the drawings. In the following description, when a conduction terminal of a TFT functions as a drain terminal and a source terminal, the conduction terminal is fixedly called a drain terminal or a source terminal. Furthermore, a signal input or output through a terminal is called with a same name as the terminal (for example, a signal input through a clock terminal CKA is called a clock signal CKA). It is assumed that (X mod Y) represents a remainder obtained when X is divided by Y, m and n are integers not less than 2, i is an integer not less than 1 and not more than m, and j is an integer not less than 1 and not more than n.

First Embodiment

Figure 1:
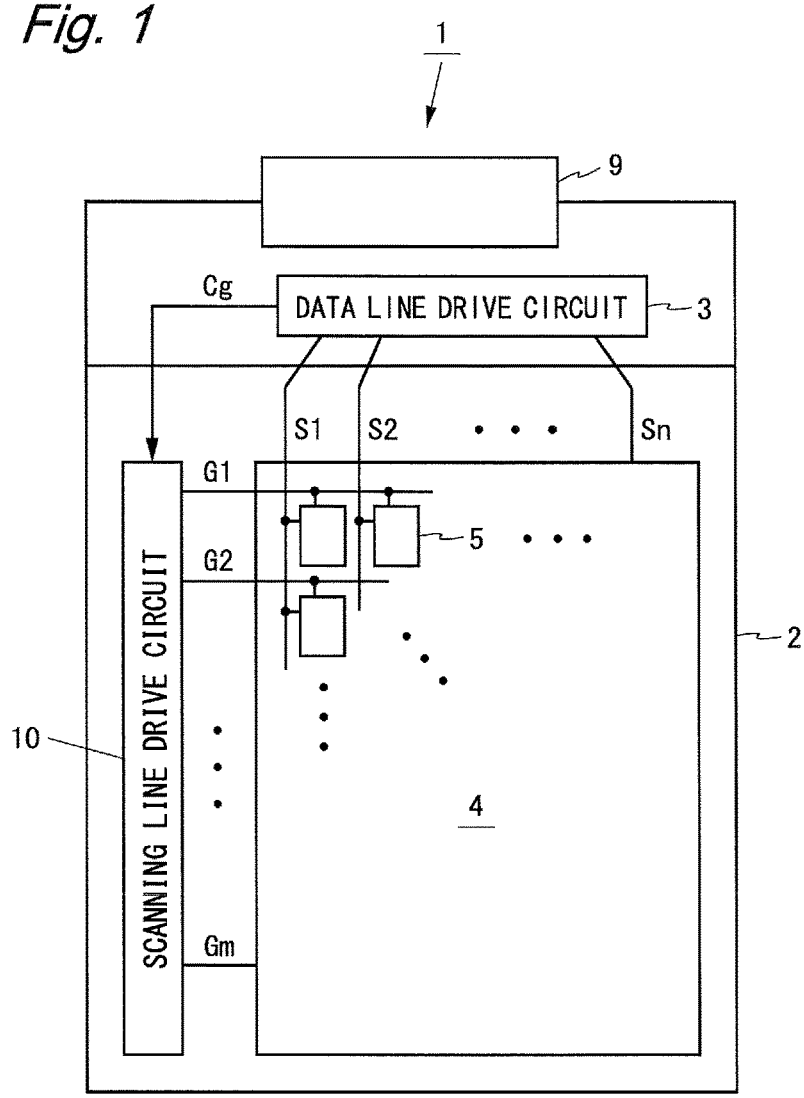
FIG. 1 is a block diagram showing a configuration of a liquid crystal display device including a scanning line drive circuit according to a first embodiment.

FIG. 1 is a block diagram showing a configuration of a liquid crystal display device including a scanning line drive circuit according to a first embodiment. A liquid crystal display device 1 shown in FIG. 1 includes a liquid crystal panel 2, a scanning line drive circuit 10, and a data line drive circuit 3. The liquid crystal panel 2 has a display area 4. The display area 4 includes m scanning lines G1 to Gm, n data lines S1 to Sn, and (m×n) pixel circuits 5. The scanning lines G1 to Gm are arranged in parallel with each other. The data lines S1 to Sn are arranged in parallel with each other so as to intersect with the scanning lines G1 to Gm perpendicularly. The scanning lines G1 to Gm and the data lines S1 to Sn intersect at (m×n) points. The (m×n) pixel circuits 5 are arranged two-dimensionally corresponding to intersections of the scanning lines G1 to Gm and the data lines S1 to Sn.

Figure 2:
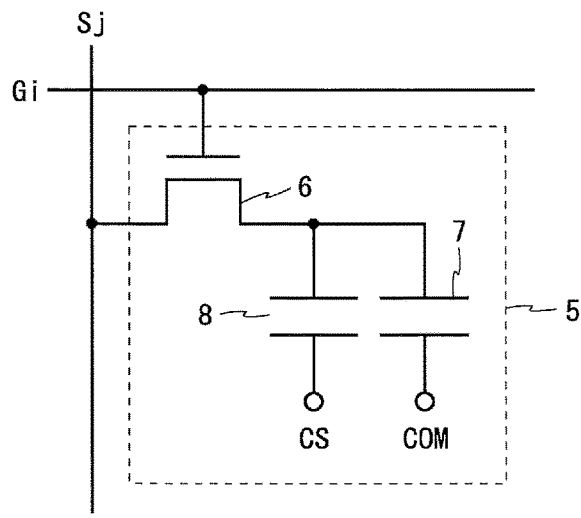
FIG. 2 is a circuit diagram of a pixel circuit in the liquid crystal display device shown in FIG. 1.

FIG. 2 is a circuit diagram of the pixel circuit 5. FIG. 2 shows a pixel circuit 5 in an i-th row and a j-th column. The pixel circuit 5 includes a TFT 6, a liquid crystal capacitance 7, and an auxiliary capacitance 8. A gate terminal of the TFT 6 is connected to a scanning line Gi, a source terminal of the TFT 6 is connected to a data line Sj, and a drain terminal of the TFT 6 is connected to one electrodes (upper electrodes in FIG. 2) of the liquid crystal capacitance 7 and the auxiliary capacitance 8. The other electrode of the liquid crystal capacitance 7 is connected to a common electrode COM, and the other electrode of the auxiliary capacitance 8 is connected to an auxiliary capacitance line CS.

The scanning line drive circuit 10 is monolithically formed on the liquid crystal panel 2 using a same manufacturing process as that of the TFT 6 (gate driver monolithic configuration). The scanning line drive circuit 10 is arranged along one side (left side in FIG. 1) of two sides parallel to the data lines S1 to Sn among sides of the display area 4. One ends (left ends in FIG. 1) of the scanning lines G1 to Gm are connected to the scanning line drive circuit 10. The data line drive circuit 3 is included in an IC chip, and the IC chip including the data line drive circuit 3 is mounted on a peripheral portion of the display area 4 on the liquid crystal panel 2. A flexible printed board 9 is connected to the liquid crystal panel 2.

The scanning line drive circuit 10 drives the scanning lines G1 to Gm in accordance with a control signal Cg supplied from the data line drive circuit 3. The data line drive circuit 3 drives the data lines S1 to Sn based on a video signal (not shown) supplied from an outside of the liquid crystal display device 1 via the flexible printed board 9. More specifically, m line periods are included in one frame period of the liquid crystal display device 1. In each line period, the scanning line drive circuit 10 selects one scanning line from among the scanning lines G1 to Gm, applies a high-level voltage to a plurality of the scanning line including the selected scanning line, and applies a low-level voltage to other scanning lines. In the pixel circuits 5 connected to the scanning line to which the high-level voltage is applied, the TFT 6 turns on. In each line period, the data line drive circuit 3 applies n voltages in accordance with the video signal (hereinafter referred to as data voltages) to the data lines S1 to Sn. Before the line period finishes (or when it finishes), the scanning line drive circuit 10 makes a voltage applied to the selected scanning line change from the high-level voltage to the low-level voltage.

Accordingly, the TFT 6 turns off in each of n pixel circuits 5 connected to the selected scanning line, and the n data voltages are respectively written to the n pixel circuits 5. The pixel circuit 5 corresponds to one sub-pixel. Brightness of the sub-pixel is changed in accordance with the data voltage written to the pixel circuit 5. Therefore, a desired image can be displayed on the liquid crystal panel 2 by writing (m×n) data voltages to the (m×n) pixel circuits 5 using the scanning line drive circuit 10 and the data line drive circuit 3. Note that the control signal Cg may be supplied to the scanning line drive circuit 10 from the outside of the liquid crystal display device 1 via the flexible printed board 9.

Figure 3:
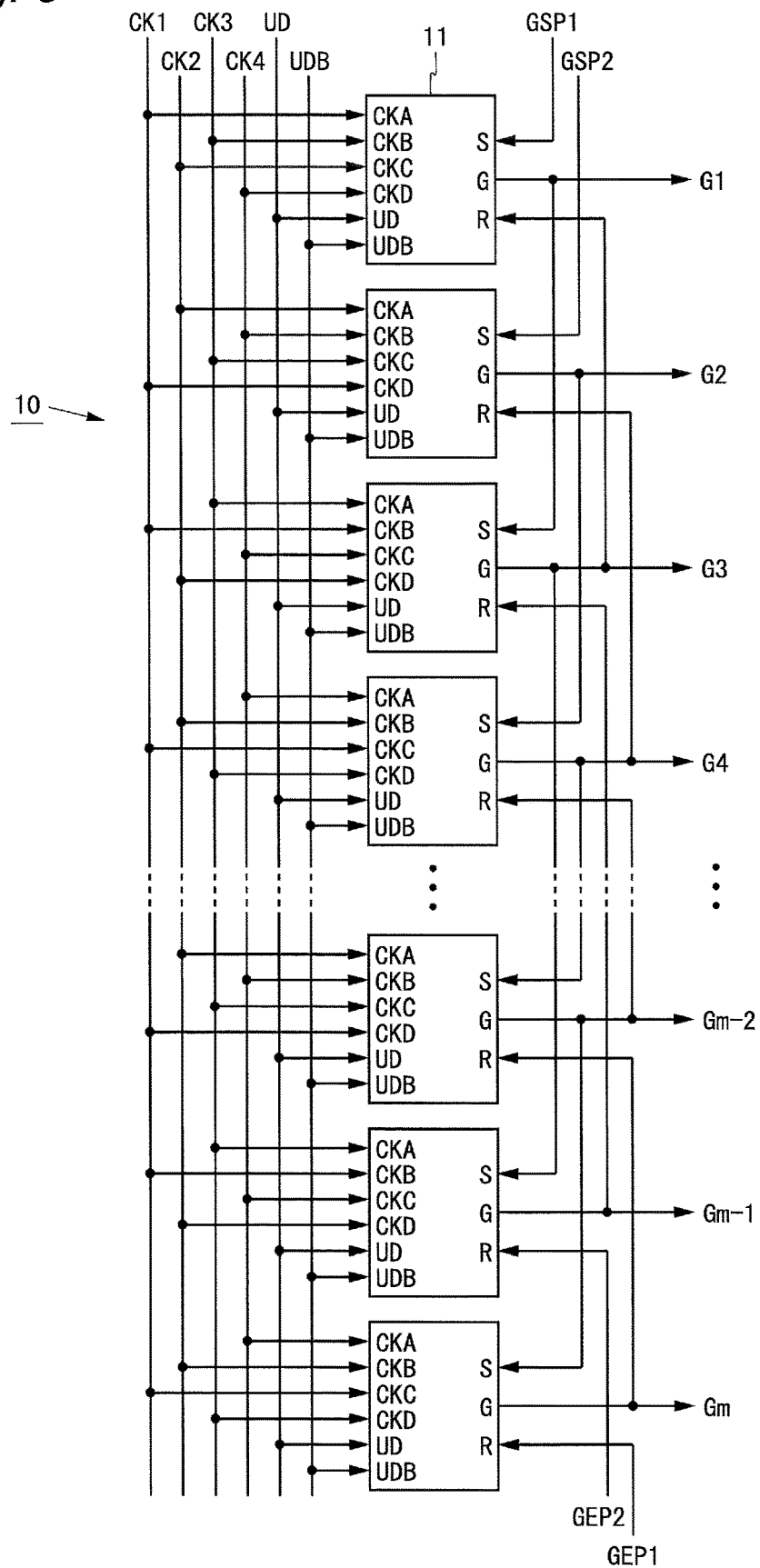
FIG. 3 is a block diagram showing a configuration of the scanning line drive circuit according to the first embodiment.

FIG. 3 is a block diagram showing a configuration of the scanning line drive circuit 10. The scanning line drive circuit 10 shown in FIG. 3 has a configuration in which m unit circuits 11 are connected in multi-stage. The configuration shown in FIG. 3 is an example of a case where m is a multiple of 4 and is not less than 8. The unit circuit 11 has clock terminals CKA, CKB, CKC, CKD, control terminals UD, UDB, a set terminal S, a reset terminal R, and an output terminal G. Four phase clock signals CK1 to CK4, control signals UD, UDB, gate start pulses GSP1, GSP2, and gate end pulses GEP1, GEP2 are supplied to the scanning line drive circuit 10.

The control signals UD, UDB are respectively supplied to the control terminals UD, UDB of the unit circuit 11 in each stage. Clock signals CKa, CKb, CKc, CKd are respectively supplied to the clock terminals CKA, CKB, CKC, CKD of the unit circuit 11 in an i-th stage. Here, a=(i−1) mod 4+1, b=(i+1) mod 4+1, c=i mod 4+1, and d=(i+2) mod 4+1. The gate start pulses GSP1, GSP2 are respectively supplied to the set terminals S of the unit circuits 11 in a first stage and a second stage. An output signal G of the unit circuit 11 in a second previous stage is supplied to the set terminal S of each of other unit circuits 11. The gate end pulses GSP2, GEP1 are respectively supplied to the reset terminals R of the unit circuits 11 in an (m−1)-th stage and an m-th stage. An output signal G of the unit circuit 11 in a second next stage is supplied to the reset terminal R of each of other unit circuits 11. An output signal G of the unit circuit 11 in the i-th stage is applied to a scanning line Gi.

The scanning line drive circuit 10 switches a scanning direction in accordance with the control signals UD, UDB. When the control signal UD is in a high level and the control signal UDB is in a low level, the scanning line drive circuit 10 selects the scanning lines G1 to Gm in an ascending order (in an order of G1, G2, . . . , Gm−1, Gm). When the control signal UD is in the low level and the control signal UDB is in the high level, the scanning line drive circuit 10 selects the scanning lines G1 to Gm in a descending order (in an order of Gm, Gm−1, . . . , G2, G1). Hereinafter, the former is referred to as a forward direction scanning, and the latter is referred to as a backward direction scanning. The control signal UDB may be a negative signal of the control signal UD, or may be a signal which is changed independently from the control signal UD. In the latter case, both of the control signals UD, UDB may become the low level in a vertical retrace period, for example.

Figure 4A:
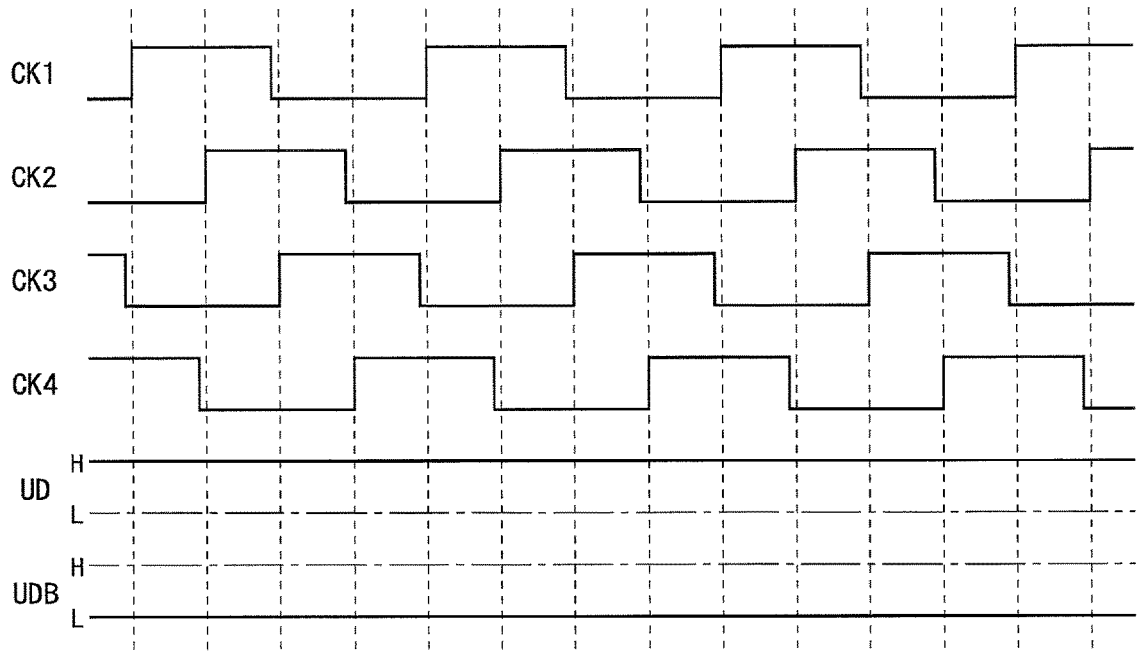
FIG. 4A is a diagram showing clock signals and control signals when the scanning line drive circuit shown in FIG. 3 performs a forward direction scanning.
Figure 4B:
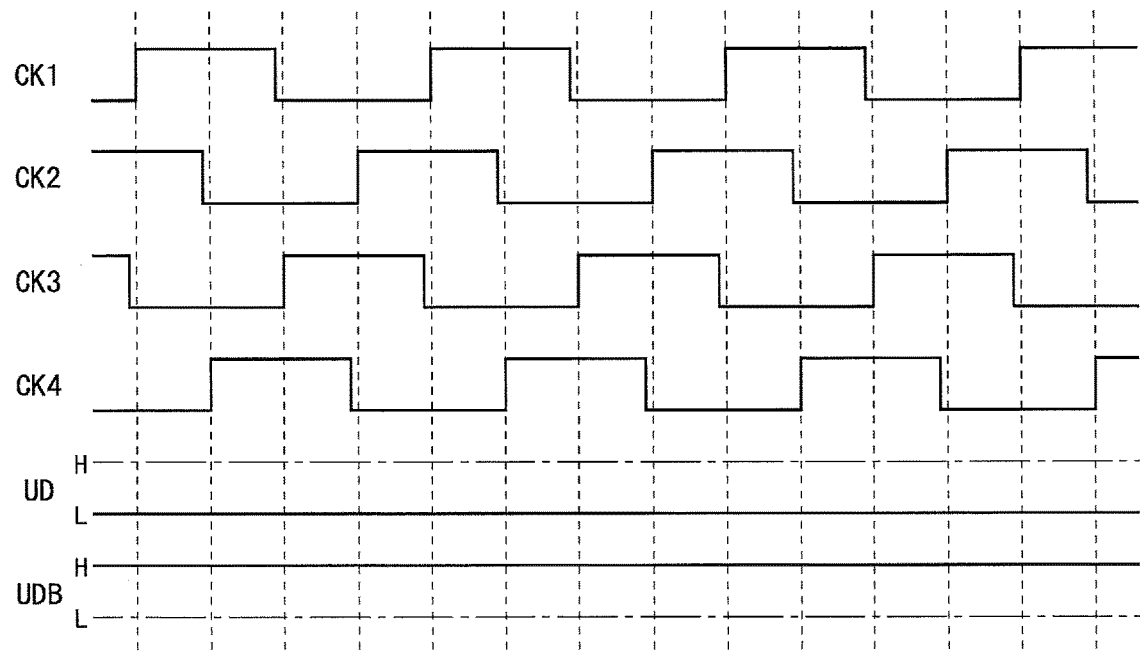
FIG. 4B is a diagram showing the clock signals and the control signals when the scanning line drive circuit shown in FIG. 3 performs a backward direction scanning.

The clock signals CK1 to CK4 become the high level in a time not shorter than ¼ cycle and shorter than half cycle (specifically, in a time slightly shorter than half cycle) within one cycle, and become the low level in the remaining time. FIG. 4A is a diagram showing clock signals and control signals when the scanning line drive circuit 10 performs the forward direction scanning. In this case, the clock signals CK2, CK3 are behind the clock signal CK1 by ¼ cycle and half cycle, respectively. The clock signal CK4 is ahead of the clock signal CK1 by ¼ cycle. FIG. 4B is a diagram showing the clock signals and the control signals when the scanning line drive circuit 10 performs the backward direction scanning. In this case, the clock signal CK2 is ahead of the clock signal CK1 by ¼ cycle. The clock signals CK3, CK4 are behind the clock signal CK1 by half cycle and ¼ cycle, respectively.

Figure 5:
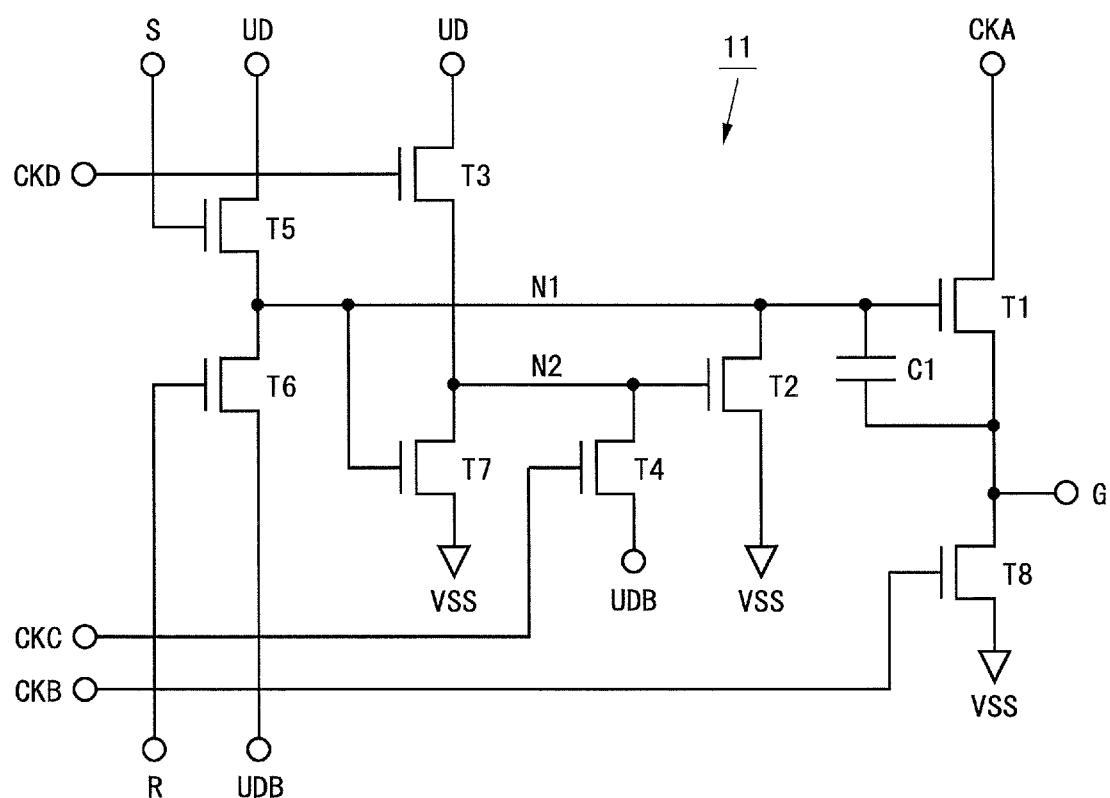
FIG. 5 is a circuit diagram of a unit circuit of the scanning line drive circuit shown in FIG. 3.

FIG. 5 is a circuit diagram of the unit circuit 11. The unit circuit 11 includes eight N-channel type TFTs T1 to T8 and a capacitor C1. For the N-channel type transistor, the high level is an ON level and the low level is an OFF level. A drain terminal of the TFT T5 is connected to the control terminal UD, and a gate terminal of the TFT T5 is connected to the set terminal S. A drain terminal of the TFT T6 is connected to the control terminal UDB, and a gate terminal of the TFT T6 is connected to the reset terminal R. Source terminals of the TFTs T5, T6 are connected to gate terminals of the TFTs T1, T7 and a drain terminal of the TFT T2. A drain terminal of the TFT T3 is connected to the control terminal UD, and a gate terminal of the TFT T3 is connected to the clock terminal CKD. A drain terminal of the TFT T4 is connected to the control terminal UDB, and a gate terminal of the TFT T4 is connected to the clock terminal CKC. Source terminals of the TFTs T3, T4 are connected to a gate terminal of the TFT T2 and a drain terminal of the TFT T7. A drain terminal of the TFT T1 is connected to the clock terminal CKA, and a source terminal of the TFT T1 is connected to a drain terminal of the TFT T8 and the output terminal G. A gate terminal of the TFT T8 is connected to the clock terminal CKB. A low-level voltage VSS is applied to source terminals of the TFTs T2, T7, T8. The capacitor C1 is provided between the gate terminal and the source terminal of the TFT T1. A size of the TFT T7 is sufficiently larger than sizes of the TFTs T3, T4. The TFTs T2 to T4, T7 function as a stabilization circuit for stabilizing a voltage of the gate terminal of the TFT T1. Hereinafter, a node to which the gate terminal of the TFT T1 is connected is referred to as N1, and a node to which the gate terminal of the TFT T2 is connected is referred to as N2.

Figure 6A:
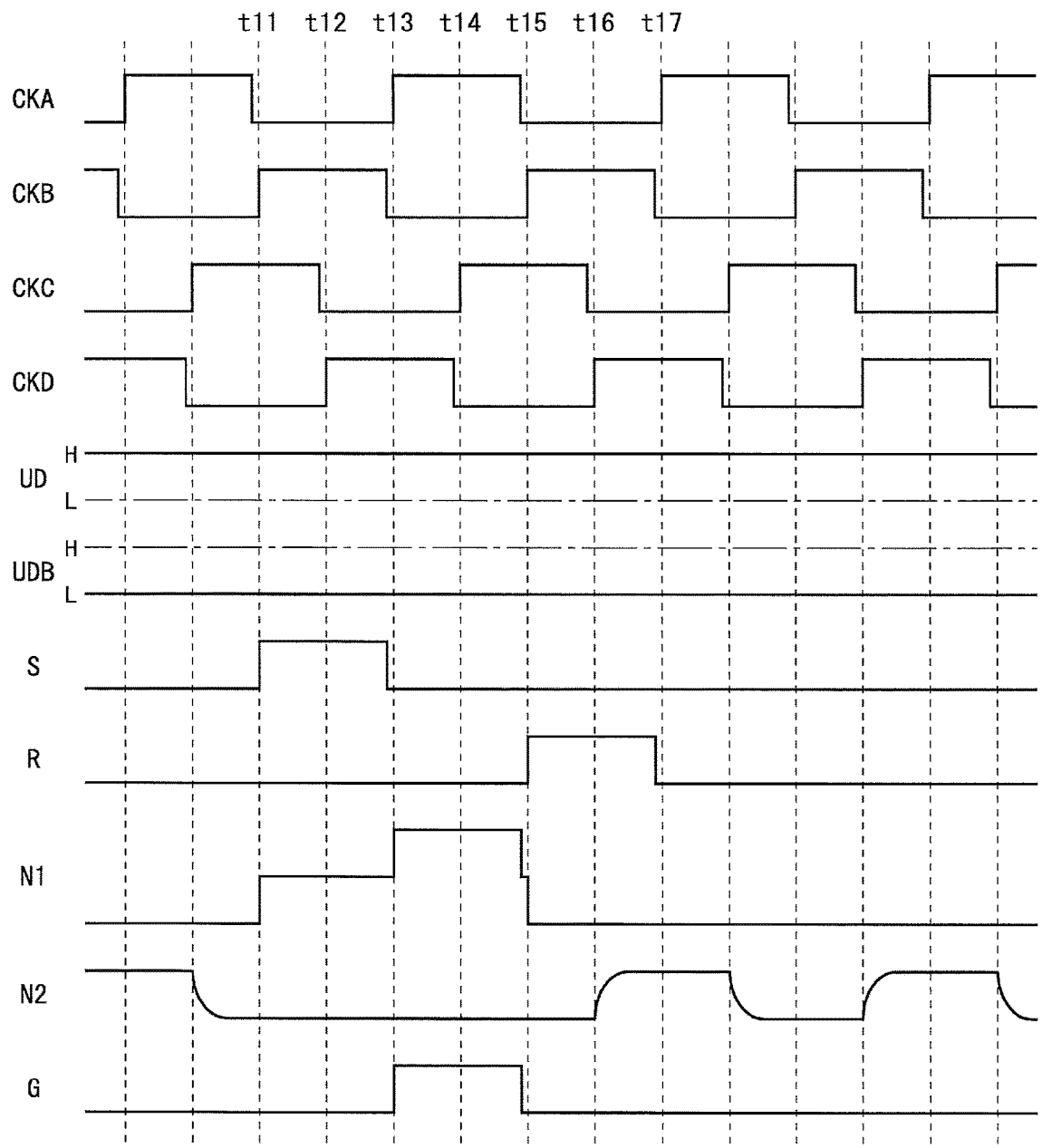
FIG. 6A is a timing chart when the scanning line drive circuit shown in FIG. 3 performs the forward direction scanning.

FIG. 6A is a timing chart when the scanning line drive circuit 10 performs the forward direction scanning. In the following, an operation of the unit circuit 11 when performing the forward direction scanning will be described with reference to FIG. 6A. Immediately before time t11, the clock signal CKC is in the high level, other clock signals, the set signal S, the reset signal R, voltages of the nodes N1, N2, and the output signal G are in the low level, the TFT T4 is in an ON state, and other TFTs are in an OFF state. At time t11, the clock signal CKB and the set signal S are changed to the high level. Thus, the TFTs T5, T8 turn on. Accordingly, a voltage of the node N1 becomes the high level and the TFTs T1, T7 turn on.

Before time t12, the clock signal CKC is changed to the low level. Thus, the TFT T4 turns off. At the time t12, the clock signal CKD is changed to the high level. Thus, the TFT T3 turns on. As described above, the size of the TFT T7 is sufficiently larger than the size of the TFT T3. Therefore, a voltage of the node N2 is kept at the low level, even if the TFT T3 turns on when the TFT T7 is in the ON state.

Before time t13, the clock signal CKB and the set signal S are changed to the low level. Thus, the TFTs T5, T8 turn off. At the time t13, the clock signal CKA is changed to the high level. Since the TFT T1 is in the ON state at this time, as a voltage of the drain terminal of the TFT T1 is increased, a voltage of the source terminal of the TFT T1 is also increased. Since the capacitor C1 is provided between the gate terminal and the source terminal of the TFT T1, the voltage of the node N1 is also increased. The voltage of the node N1 becomes higher than a normal high level by a bootstrap effect. Therefore, a voltage of the output signal G becomes a same level as the high-level voltage of the clock signal CKA without falling by a threshold voltage of the TFT T1.

Before time t14, the clock signal CKD is changed to the low level. Thus, the TFT T3 turns off. At the time t14, the clock signal CKC is changed to the high level. Thus, the TFT T4 turns on. Before time t15, the clock signal CKA is changed to the low level. Thus, the voltage of the node N1 returns to the normal high level and the output signal G becomes the low level. At the time t15, the clock signal CKB and the reset signal R are changed to the high level. Thus, the TFTs T6, T8 turn on. Accordingly, the voltage of the node N1 becomes the low level and the TFTs T1, T7 turn off. The output signal G becomes the low level certainly.

Before time t16, the clock signal CKC is changed to the low level. Thus, the TFT T4 turns off. At the time t16, the clock signal CKD is changed to the high level. Thus, the TFT T3 turns on. Accordingly, the voltage of the node N2 becomes the high level and the TFT T2 turns on. Before time t17, the clock signal CKB is changed to the low level. Thus, the TFT T8 turns off. At the time t17, the clock signal CKA is changed to the high level. Since the TFT T1 is in the OFF state at this time, the output signal G is kept at the low level, even if the clock signal CKA is changed to the high level.

After the time t17, the voltage of the node N2 becomes the high level when clock signal CKD is changed to the high level, and becomes the low level when the clock signal CKC is changed to the high level. The voltage of the node N1 is kept at the low level until the set signal S next becomes the high level. The output signal G is kept at the low level until the clock signal CKA becomes the high level after the set signal S next becomes the high level. In the unit circuit 11, the voltage of the node N2 is changed to the high level and the low level while the voltage of the node N1 is in the low level.

Figure 6B:
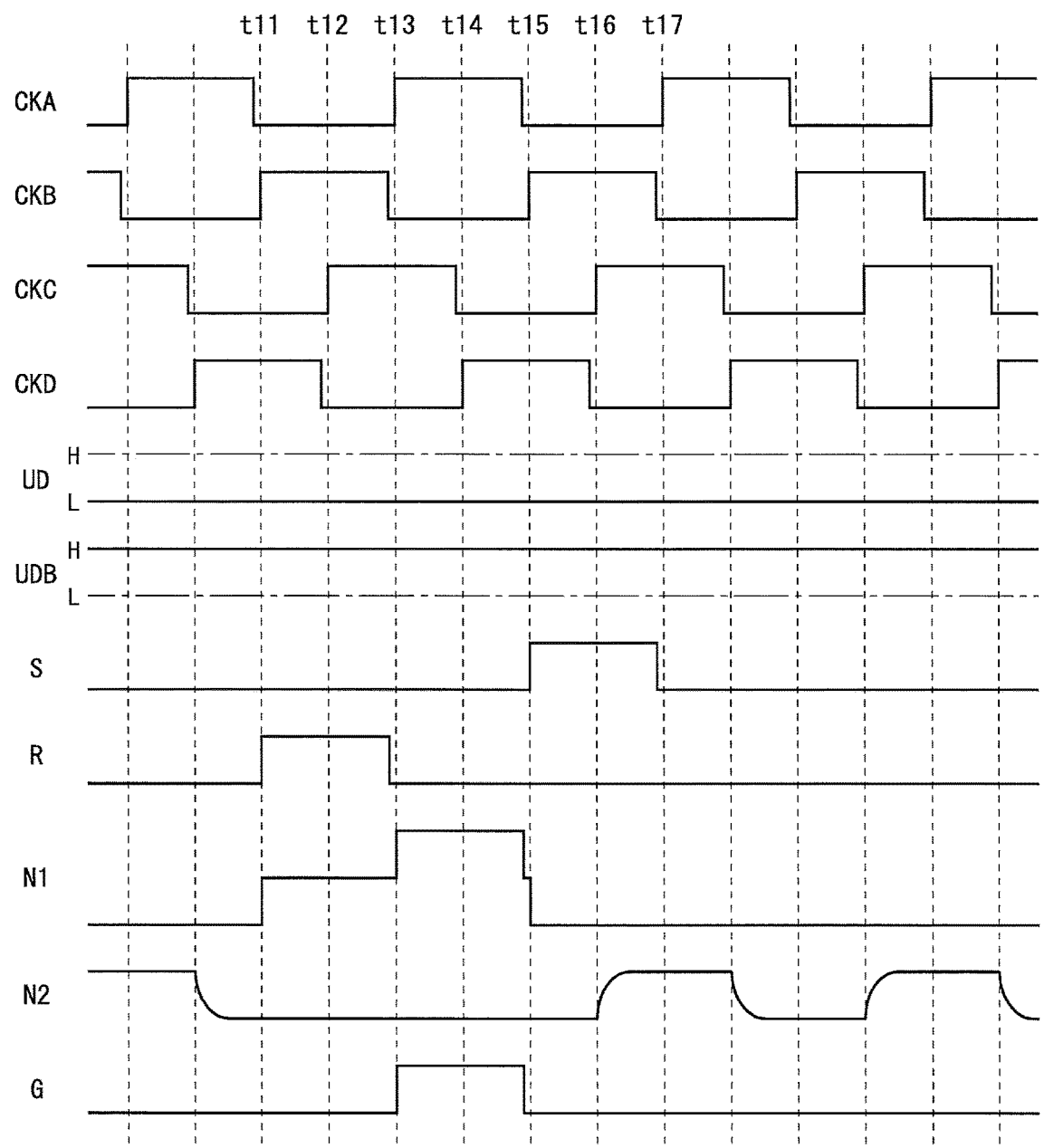
FIG. 6B is a timing chart when the scanning line drive circuit shown in FIG. 3 performs the backward direction scanning.

FIG. 6B is a timing chart when the scanning line drive circuit 10 performs the backward direction scanning. An operation of the unit circuit 11 in the backward direction scanning is same as the operation of the unit circuit 11 in the forward direction scanning when exchanging the clock signal CKC for the clock signal CKD, exchanging the set signal S for the reset signal R, and exchanging the TFTs T3, T5 for the TFTs T4, T6. As shown in FIGS. 6A and 6B, the voltage of the node N1 and the output signal G are changed in a same manner in the forward direction scanning and the backward direction scanning.

Figure 7:
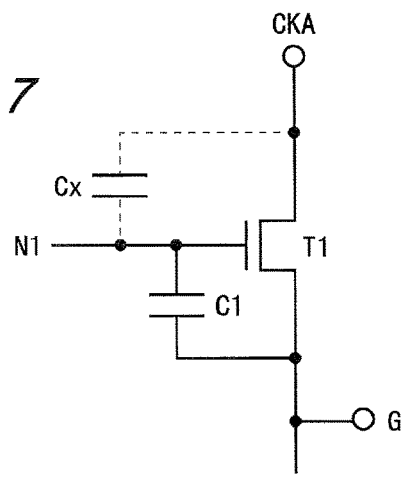
FIG. 7 is a diagram showing a parasitic capacitance which occurs in the unit circuit shown in FIG. 5.
Figure 8:
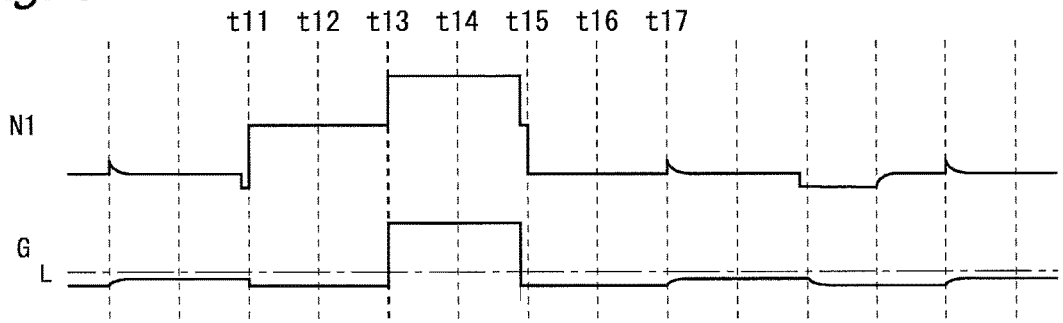
FIG. 8 is a diagram showing noise suppressed by the scanning line drive circuit shown in FIG. 3.

In the following, effects of the scanning line drive circuit 10 according to the present embodiment will be described with reference to FIGS. 7 to 9. As shown in FIG. 7, a parasitic capacitance Cx occurs between the drain terminal and the gate terminal of the TFT T1 in the unit circuit 11. Thus, if the clock signal CKA is changed to the high level while the voltage of the node N1 is in the low level, the voltage of the node N1 is increased slightly. The output signal G is also changed slightly by a leakage current flowing through the TFT T1 at this time. Thus, if a scanning line drive circuit is designed without any special contrivance, noise shown in FIG. 8 is imposed on the voltage of the node N1 and the output signal G. According to the scanning line drive circuit 10, the noise shown in FIG. 8 can be suppressed.

When the scanning line drive circuit 10 performs the forward direction scanning, the voltage of the node N2 is changed to the high level when the clock signal CKD is changed to the high level. In this case, the clock signal CKD is ahead of the clock signal CKA by ¼ cycle (see FIG. 6A). Therefore, when the clock signal CKA is changed to the high level, the voltage of the node N2 is already in the high level and the TFT T2 is already in the ON state.

When the scanning line drive circuit 10 performs the backward direction scanning, the voltage of the node N2 is changed to the high level when the clock signal CKC is changed to the high level. In this case, the clock signal CKC is ahead of the clock signal CKA by ¼ cycle (see FIG. 6B). Therefore, when the clock signal CKA is changed to the high level, the voltage of the node N2 is already in the high level and the TFT T2 is already in the ON state.

In both cases, even if the voltage of the node N1 is increased when the clock signal CKA is changed to the high level, the voltage of the node N1 becomes the low level immediately by an action of the TFT T2. Therefore, noise imposed on the voltage of the node N1 can be suppressed. Furthermore, since the leakage current flowing through the TFT T1 is decreased, noise imposed on the output signal G can be suppressed. Therefore, according to the scanning line drive circuit 10, it is possible to prevent a malfunction and an abnormal display in the liquid crystal display device 1.

Figure 9:
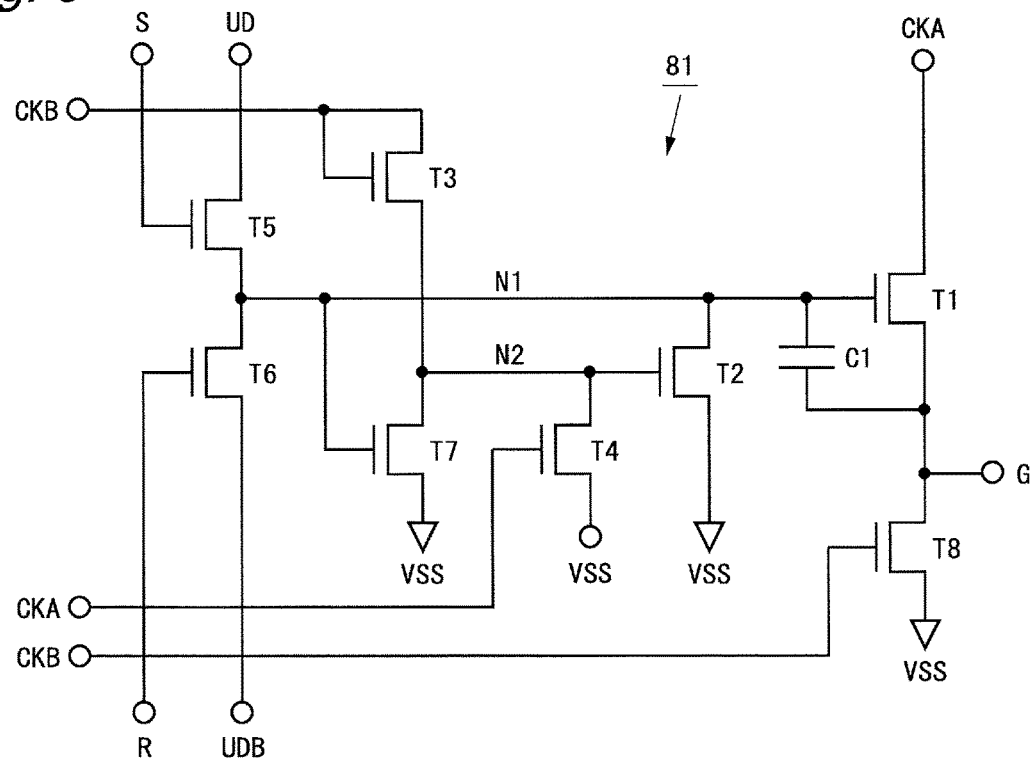
FIG. 9 is a circuit diagram of a unit circuit of a scanning line drive circuit according to a comparative example.

Consider a scanning line drive circuit in which unit circuits 81 shown in FIG. 9 are connected in multi-stage, as a scanning line drive circuit according to a comparative example. In the unit circuit 81, the drain terminal and the gate terminal of the TFT T3 are connected to the clock terminal CKB. The drain terminal of the TFT T4 is connected to the node N2, the low-level voltage VSS is applied to the source terminal of the TFT T4, and the gate terminal of the TFT T4 is connected to the clock terminal CKA.

In the unit circuit 81, when the clock signal CKB is changed to the high level, the TFT T3 turns on and the voltage of the node N2 becomes the high level. When the clock signal CKA is changed to the high level, the TFT T4 turns on and the voltage of the node N2 becomes the low level. Since a size of the TFT T4 is intentionally designed small, dullness occurs in a voltage waveform of the node N2 when the clock signal CKA is changed to the high level. According to the unit circuit 81, it is possible to suppress noise imposed on the voltage of the node N1 when the clock signal CKA is changed to the high level, by controlling the TFT T2 using a signal with the dullness. However, since it is necessary to increase a size of the TFT T2 in order to perform a noise control by the dullness of the voltage waveform the node N2, a size of the scanning line drive circuit according to the comparative example is increased.

On the other hand, in the unit circuit 11, the clock signal CKD becomes the high level before the clock signal CKA in the forward direction scanning, and the clock signal CKC becomes the high level before the clock signal CKA in the backward direction scanning. Thus, when the clock signal CKA is changed to the high level, the voltage of the node N2 is already in the high level and the TFT T2 is already in the ON state. Therefore, without increasing the size of the TFT T2, even if the voltage of the node N1 is increased when the clock signal CKA is changed to the high level, the voltage of the node N1 becomes the low level immediately. Therefore, according to the scanning line drive circuit 10 according to the present embodiment, a small-sized scanning line drive circuit having the function of switching the scanning direction and capable of preventing the malfunction. Furthermore, a frame size (width of the peripheral portion of the display area 4) of the liquid crystal panel 2 can be reduced.

In the liquid crystal display device 1, an operation of the scanning line drive circuit 10 may be suspended while displaying. In this case, it is necessary to keep the voltage of the node N1 in a suspending period. Even in such a case, since the TFT T2 may be designed small, it is possible to reduce a leakage current flowing through the TFT T2 and keep the voltage of the node N1 more easily.

In the present embodiment, the control signal UD corresponds to a first control signal being the ON level (high level) in the forward direction scanning and being the OFF level (low level) in the backward direction scanning. The control signal UDB corresponds to a second control signal being the OFF level in the forward direction scanning and being the ON level in the backward direction scanning. The clock signal CKA corresponds to a first clock signal. The clock signal CKD corresponds to a second clock signal being ahead of the first clock signal by a first time (¼ cycle) in the forward direction scanning, and being behind the first clock signal by the first time in the backward direction scanning. The clock signal CKC corresponds to a third clock signal being behind the first clock signal by the first time in the forward direction scanning, and being ahead of the first clock signal by the first time in the backward direction scanning. The clock signal CKB corresponds to a fourth clock signal being behind the first clock signal by half cycle.

The unit circuit 11 includes an output transistor (TFT T1) having a first conduction terminal (drain terminal) to which the first clock signal is supplied, a second conduction terminal (source terminal) connected to the output terminal G, and a control terminal (gate terminal) connected to a first node (node N1), a first transistor (TFT T2) having a first conduction terminal connected to the first node, a second conduction terminal to which an off-level voltage (low-level voltage) is applied, and a control terminal connected to the second node (node N2), a second transistor (TFT T7) having a first conduction terminal connected to the second node, a second conduction terminal to which the off-level voltage is applied, and a control terminal connected to the first node, a third transistor (TFT T3) having a first conduction terminal to which the first control signal is supplied, a second conduction terminal connected to the second node, and a control terminal to which the second clock signal is supplied, and applying an on-level voltage (high-level voltage) to the second node based on the second clock signal, and a fourth transistor (TFT T4) having a first conduction terminal to which the second control signal is supplied, a second conduction terminal connected to the second node, and a control terminal to which the third clock signal is supplied, and applying the on-level voltage to the second node based on the third clock signal. The unit circuit 11 is configured so that a voltage of the second node is changed to the ON level and the OFF level while a voltage of the first node is in the OFF level. The unit circuit 11 is configured so that the voltage of the second node is in the ON level when the first clock signal is changed to the ON level while the voltage of the first node is in the OFF level. A size of the second transistor is larger than sizes of the third and fourth transistors.

The unit circuit 11 further includes a fifth transistor (TFT T5) having a first conduction terminal to which the first control signal is supplied, a second conduction terminal connected to the first node, and a control terminal to which an output signal of the unit circuit in a front-side stage (unit circuit in second previous stage) is supplied, a sixth transistor (TFT T6) having a first conduction terminal to which the second control signal is supplied, a second conduction terminal connected to the first node, and a control terminal to which an output signal of the unit circuit in a back-side stage (unit circuit in second next stage) is supplied, and an output reset transistor (TFT T8) having a first conduction terminal connected to the output terminal G, a second conduction terminal to which the off-level voltage is applied, and a control terminal to which the fourth clock signal is supplied. The fifth transistor and the sixth transistor constitute a first node control circuit for controlling a voltage of the first node based on the output signal of the unit circuit in the front-side stage and the output signal of the unit circuit in the back-side stage.

The liquid crystal display device 1 includes a plurality of the scanning lines G1 to Gm arranged in parallel with each other, a plurality of the data lines S1 to Sn arranged in parallel with each other so as to intersect with the scanning lines G1 to Gm perpendicularly, a plurality of the pixel circuits 5 arranged corresponding to the intersections of the scanning lines G1 to Gm and the data lines S1 to Sn, and the scanning line drive circuit 10. The scanning line drive circuit 10 is monolithically formed on a display panel (liquid crystal panel 2) including the pixel circuits 5.

In the scanning line drive circuit 10 according to the present embodiment, the second clock signal becomes the ON level before the first clock signal in the forward direction scanning, and the third clock signal becomes the ON level before the first clock signal in the backward direction scanning. Thus, when the first clock signal is changed to the ON level, the voltage of the second node is already in the ON level and the first transistor is already in the ON state. Therefore, without increasing a size of the first transistor, even if the voltage of the first node is increased when the first clock signal is changed to the ON level, the voltage of the first node becomes the OFF level immediately. Therefore, according to the scanning line drive circuit 10 according to the present embodiment, it is possible to provide a small-sized scanning line drive circuit having the function of switching the scanning direction and capable of preventing the malfunction. Furthermore, since the unit circuit 11 includes the output reset transistor, the output signal becomes the OFF level certainly. Furthermore, according to the liquid crystal display device 1 including the scanning line drive circuit 10, a liquid crystal display device having the function of switching the scanning direction, capable of preventing the abnormal display, and having the liquid crystal panel 2 with a small frame size can be provided.

Second Embodiment

Figure 10:
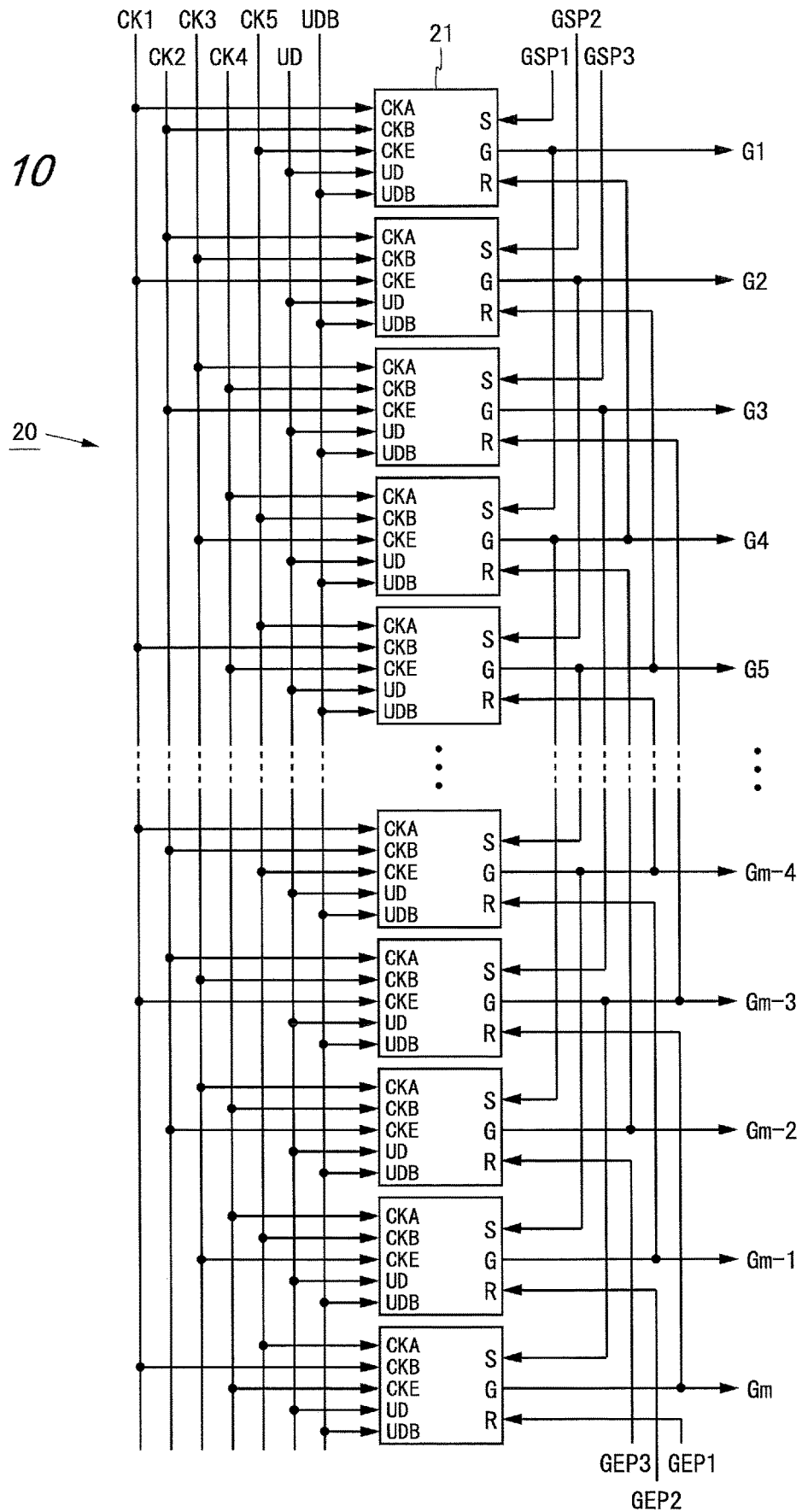
FIG. 10 is a block diagram showing a configuration of a scanning line drive circuit according to a second embodiment.

FIG. 10 is a block diagram showing a configuration of a scanning line drive circuit according to a second embodiment. A scanning line drive circuit 20 shown in FIG. 10 has a configuration in which m unit circuits 21 are connected in multi-stage, and is provided at a position of the scanning line drive circuit 10 of the liquid crystal display device 1 shown in FIG. 1. The configuration shown in FIG. 10 is an example of a case where m is a multiple of 5 and is not less than 10. The unit circuit 21 has clock terminal CKA, CKB, CKE, the control terminal UD, UDB, the set terminal S, the reset terminal R, and the output terminal G. Five phase clock signals CK1 to CK5, the control signals UD, UDB, gate start pulses GSP1 to GSP3, and gate end pulses GEP1 to GSP3 are supplied to the scanning line drive circuit 20. The scanning line drive circuit 20 switches the scanning direction in accordance with the control signals UD, UDB.

The control signals UD, UDB are respectively supplied to the control terminals UD, UDB of the unit circuit 21 in each stage. Clock signals CKa, CKb, CKe are respectively supplied to the clock terminals CKA, CKB, CKE of the unit circuit 21 in an i-th stage. Here, a=(i−1) mod 5+1, b=i mod 5+1, and e=(i+3) mod 5+1. The gate start pulses GSP1 to GSP3 are respectively supplied to the set terminals S of the unit circuits 21 in first to third stages. An output signal G of the unit circuit 21 in a third previous stage is supplied to the set terminal S of each of other unit circuits 21. The gate end pulses GSP3 to GEP1 are respectively supplied to the reset terminals R of the unit circuits 21 in (m−2)-th to m-th stages. An output signal G of the unit circuit 21 in a third next stage is supplied to the reset terminal R of each of other unit circuits 21. An output signal G of the unit circuit 21 in the i-th stage is applied to the scanning line Gi.

Figure 11A:
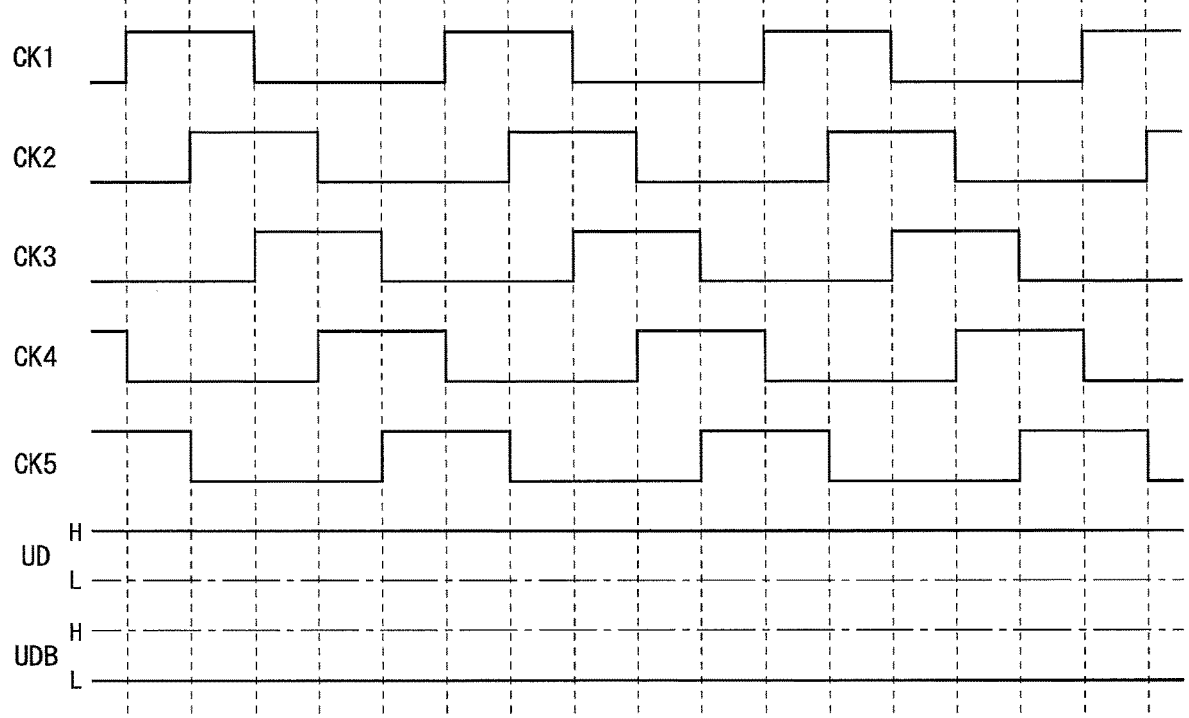
FIG. 11A is a diagram showing clock signals and control signals when the scanning line drive circuit shown in FIG. 10 performs the forward direction scanning.
Figure 11B:
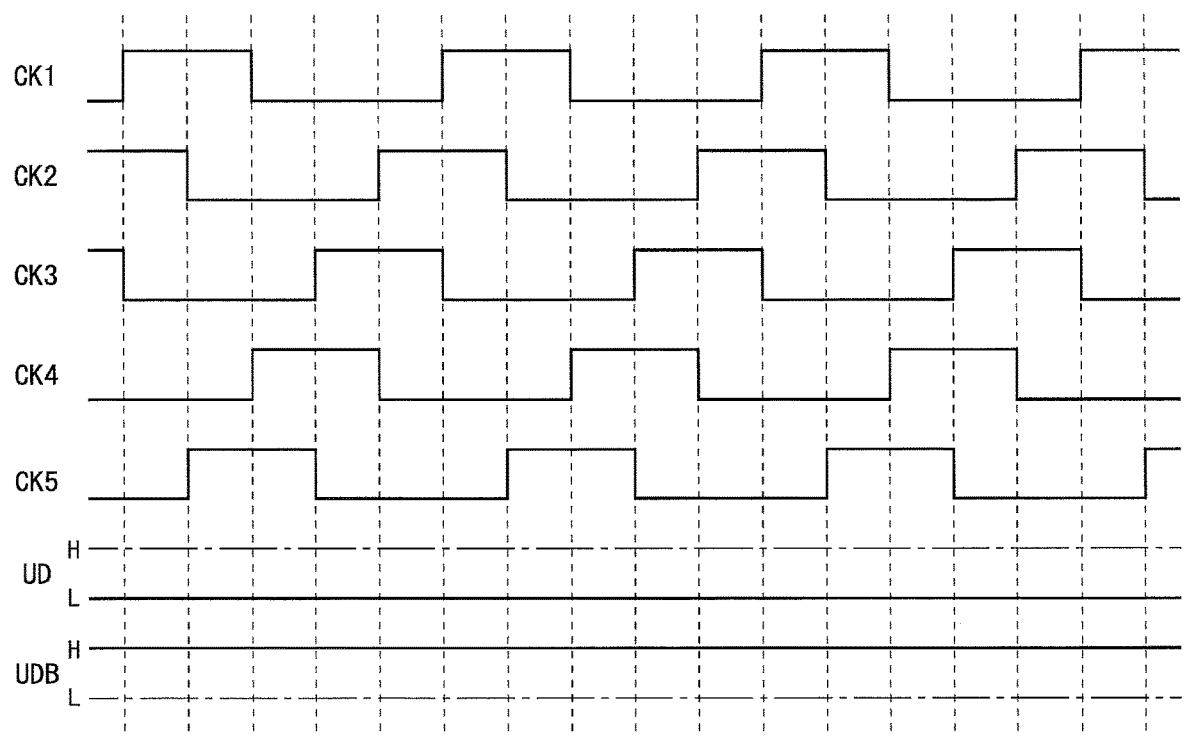
FIG. 11B is a diagram showing the clock signals and the control signals when the scanning line drive circuit shown in FIG. 10 performs the backward direction scanning.

The clock signals CK1 to CK5 become the high level in ⅖ cycle within one cycle, and become the low level in the remaining time. FIG. 11A is a diagram showing clock signals and control signals when the scanning line drive circuit 20 performs the forward direction scanning. In this case, the clock signals CK2, CK3 are behind the clock signal CK1 by ⅕ cycle and ⅖ cycle, respectively. The clock signals CK4, CK5 are ahead of the clock signal CK1 by ⅖ cycle and ⅕ cycle, respectively. FIG. 11B is a diagram showing the clock signals and the control signals when the scanning line drive circuit 20 performs the backward direction scanning. In this case, the clock signals CK2, CK3 are ahead of the clock signal CK1 by ⅕ cycle and ⅖ cycle, respectively. The clock signals CK4, CK5 are behind the clock signal CK1 by ⅖ cycle and ⅕ cycle, respectively.

Figure 12:
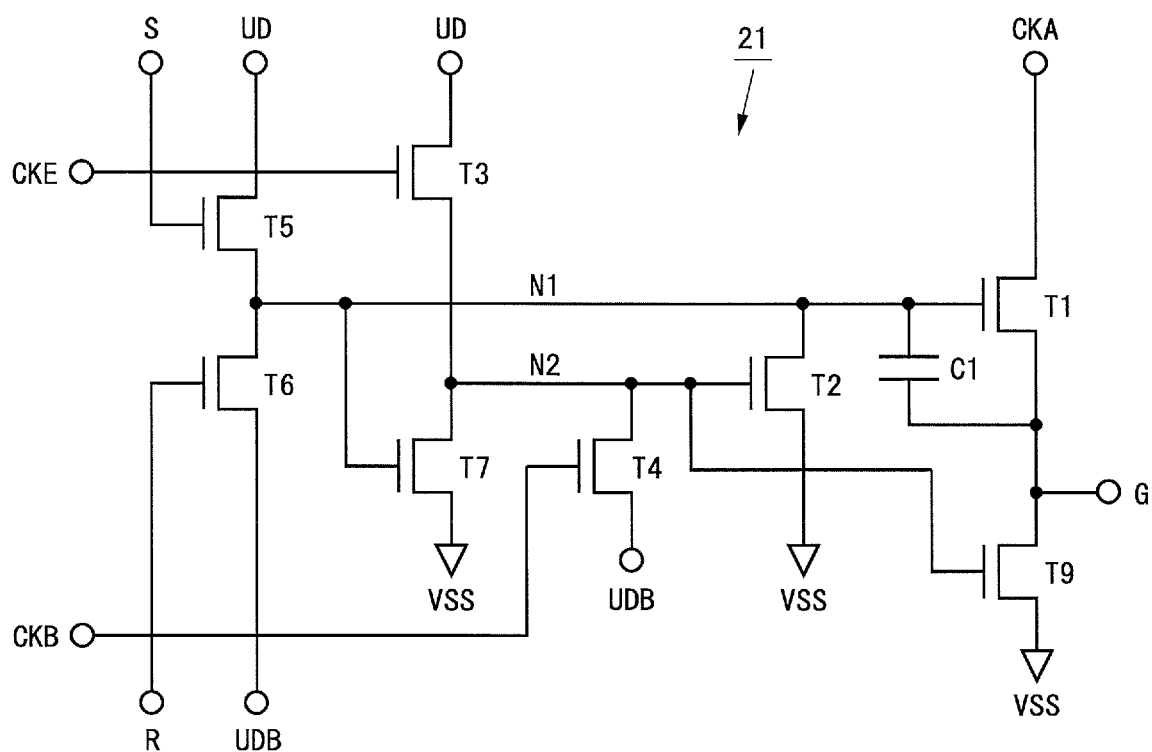
FIG. 12 is a circuit diagram of a unit circuit of the scanning line drive circuit shown in FIG. 10.

FIG. 12 is a circuit diagram of the unit circuit 21. The unit circuit 21 includes eight N-channel type TFTs T1 to T7, T9 and the capacitor C1. The unit circuit 21 is different from the unit circuit 11 according to the first embodiment in that gate terminals of the TFTs T3, T4, T9 are respectively connected to the clock terminal CKE, the clock terminal CKB, and the node N2. The TFTs T2 to T4, T7 function as a stabilization circuit for stabilizing the voltage of the gate terminal of the TFT T1.

Figure 13A:
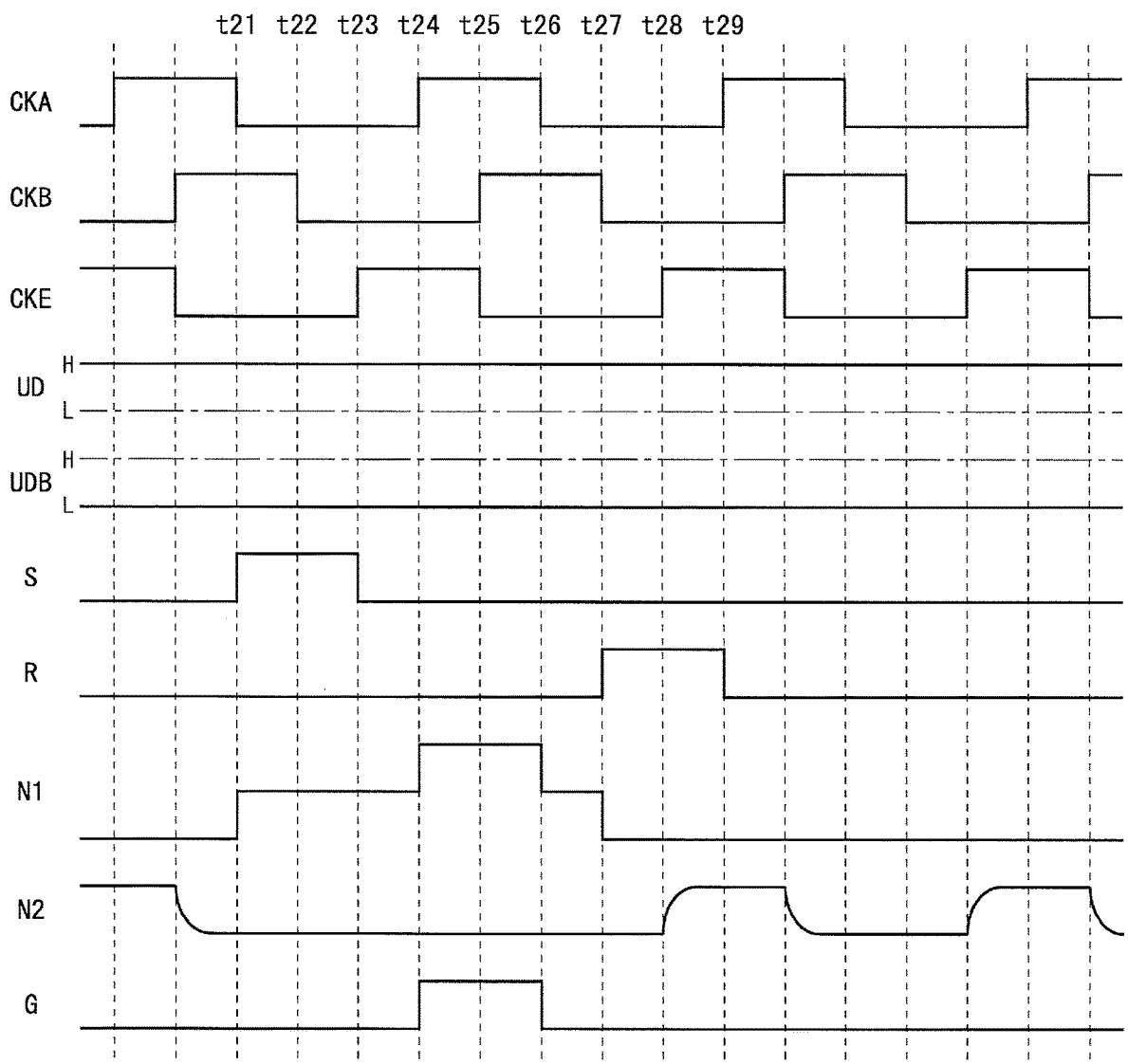
FIG. 13A is a timing chart when the scanning line drive circuit shown in FIG. 10 performs the forward direction scanning.

FIG. 13A is a timing chart when the scanning line drive circuit 20 performs the forward direction scanning. In the following, an operation of the unit circuit 21 when performing the forward direction scanning will be described with reference to FIG. 13A. Immediately before time t21, the clock signals CKA, CKB are in the high level, the clock signal CKE, the set signal S, the reset signal R, and the voltage of the nodes N1, N2 are in the low level, the TFT T4 is in the ON state, and other TFTs are in the OFF state. At the time t21, the clock signal CKA is changed to the low level and the set signal S is changed to the high level. Thus, the TFT T5 turns on. Accordingly, the voltage of the node N1 becomes the high level and the TFTs T1, T7 turn on.

At time t22, the clock signal CKB is changed to the low level. Thus, the TFT T4 turns off. At time t23, the clock signal CKE is changed to the high level and the set signal S is changed to the low level. Thus, the TFT T3 turns on and the TFT T5 turns off. As with the first embodiment, the voltage of the node N2 is kept at the low level, even if the TFT T3 turns on when the TFT T7 is in the ON state.

At time t24, the clock signal CKA is changed to the high level. As with the first embodiment, the voltage of the node N1 becomes higher than the normal high level at this time. Therefore, the voltage of the output signal G becomes the same level as the high-level voltage of the clock signal CKA without falling by the threshold voltage of the TFT T1.

At time t25, the clock signal CKB is changed to the high level and the clock signal CKE is changed to the low level. Thus, the TFT T4 turns on and the TFT T3 turns off. At time t26, the clock signal CKA is changed to the low level. Thus, the voltage of the node N1 returns to the normal high level and the output signal G becomes the low level. At time t27, the clock signal CKB is changed to the low level and the reset signal R is changed to the high level. Thus, the TFT T4 turns off and the TFT T6 turns on. Accordingly, the voltage of the node N1 becomes the low level and the TFTs T1, T7 turn off.

At time t28, the clock signal CKE is changed to the high level. Thus, the TFT T3 turns on. Accordingly, the voltage of the node N2 becomes the high level and the TFTs T2, T9 turn on. At time t29, the clock signal CKA is changed to the high level and the reset signal R is changed to the low level. Thus, the TFT T6 turns off. Since the TFT T1 is in the OFF state at this time, the output signal G is kept at the low level, even if the clock signal CKA is changed to the high level.

After the time t29, the voltage of the node N2 becomes the high level when the clock signal CKE is changed to the high level, and becomes the low level when the clock signal CKB is changed to the high level. The voltage of the node N1 is kept at the low level until the set signal S next becomes the high level. The output signal G is kept at the low level until the clock signal CKA becomes the high level after the set signal S next becomes the high level. Also in the unit circuit 21, the voltage of the node N2 is changed to the high level and the low level while the voltage of the node N1 is in the low level.

Figure 13B:
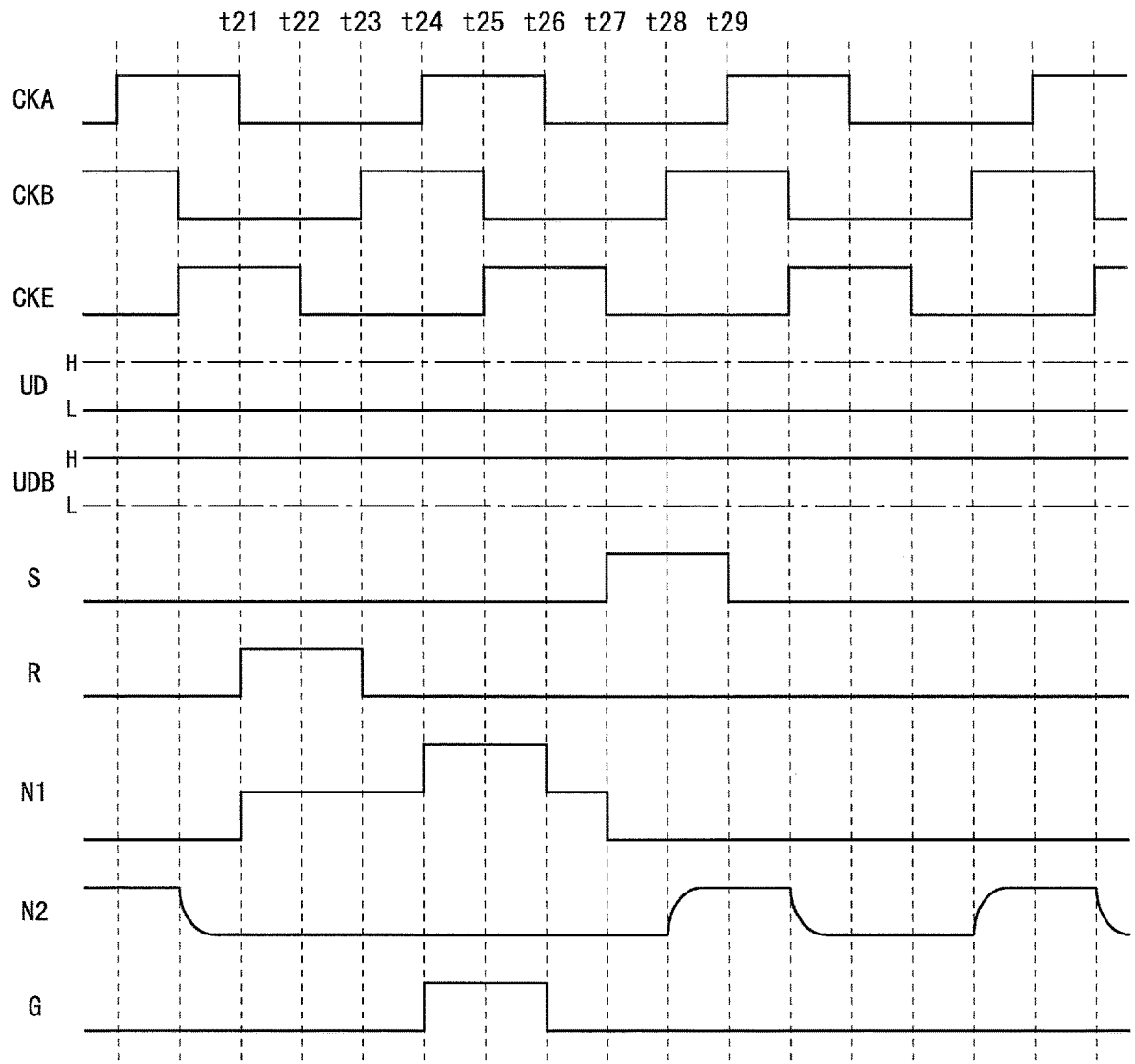
FIG. 13B is a timing chart when the scanning line drive circuit shown in FIG. 10 performs the backward direction scanning.

FIG. 13B is a timing chart when the scanning line drive circuit 20 performs the backward direction scanning. An operation of the unit circuit 21 in the backward direction scanning is same as the operation of the unit circuit 21 in the forward direction scanning when exchanging the clock signal CKB for the clock signal CKE, exchanging the set signal S for the reset signal R, and exchanging the TFTs T3, T5 for the TFTs T4, T6. As shown in FIGS. 13A and 13B, the voltage of the node N1 and the output signal G are changed in a same manner in the forward direction scanning and the backward direction scanning.

Figure 14:
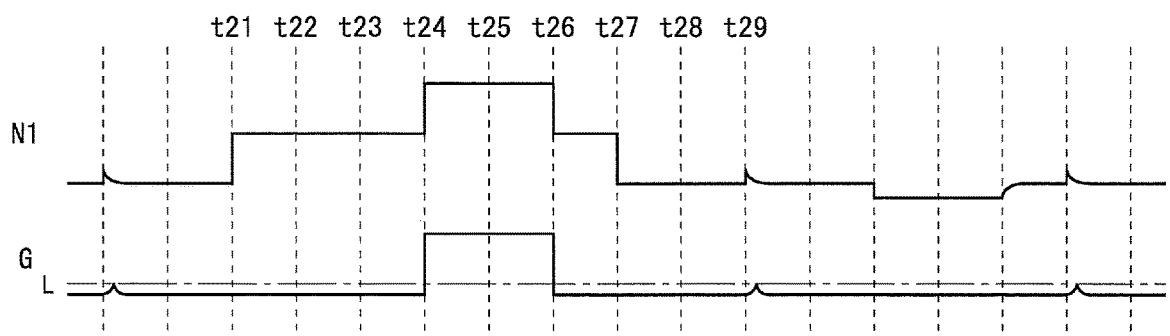
FIG. 14 is a diagram showing noise suppressed by the scanning line drive circuit shown in FIG. 10.

Also in the unit circuit 21, the parasitic capacitance Cx shown in FIG. 7 occurs between the drain terminal and the gate terminal of the TFT T1. Thus, if a scanning line drive circuit is designed without any special contrivance, noise shown in FIG. 14 is imposed on the voltage of the node N1 and the output signal G. According to the scanning line drive circuit 20, the noise shown in FIG. 14 can be suppressed.

When the scanning line drive circuit 20 performs the forward direction scanning, the voltage of the node N2 is changed to the high level when the clock signal CKE is changed to the high level. In this case, the clock signal CKE is ahead of the clock signal CKA by ⅕ cycle (see FIG. 13A). Therefore, at a time point when the clock signal CKA is changed to the high level, the voltage of the node N2 is already in the high level and the TFTs T2, T9 are already in the ON state.

When the scanning line drive circuit 20 performs the backward direction scanning, the voltage of the node N2 is changed to the high level when the clock signal CKB is changed to the high level. In this case, the clock signal CKB is ahead of the clock signal CKA by ⅕ cycle (see FIG. 13B). Therefore, at a time point when the clock signal CKA is changed to the high level, the voltage of the node N2 is already in the high level and the TFTs T2, T9 are already in the ON state.

In both cases, even if the voltage of the node N1 is increased when the clock signal CKA is changed to the high level, the voltage of the node N1 becomes the low level immediately by the action of the TFT T2. The output signal G is fixed to the low level by an action of the TFT T9 at this time. Therefore, according to the scanning line drive circuit 20, it is possible to prevent the malfunction and the abnormal display in the liquid crystal display device 1 more effectively than the scanning line drive circuit 10 according to the first embodiment.

In the present embodiment, the clock signal CKE corresponds to a second clock signal being ahead of the first clock signal (clock signal CKA) by a first time (⅛ cycle) in the forward direction scanning, and being behind the first clock signal by the first time in the backward direction scanning. The clock signal CKB corresponds to a third clock signal being behind the first clock signal by the first time in the forward direction scanning, and being ahead of the first clock signal by the first time in the backward direction scanning.

The unit circuit 21 includes the output transistor and the first to sixth transistors, as with the unit circuit 11 according to the first embodiment. An output signal of the unit circuit in a front-side stage (unit circuit in third previous stage) is supplied to a control terminal of the fifth transistor, and an output signal of the unit circuit in a back-side stage (unit circuit in third next stage) is supplied to a control terminal of the sixth transistor. The unit circuit 21 further includes a second output reset transistor (TFT T9) having a first conduction terminal connected to the output terminal G, a second conduction terminal to which the off-level voltage (low-level voltage) is applied, and a control terminal connected to the second node (node N2). The unit circuit 21 is configured so that the voltage of the second node is changed to the ON level and the OFF level while the voltage of the first node is in the OFF level. The unit circuit 21 is configured so that the voltage of the second node is in the ON level when the first clock signal is changed to the ON level while the voltage of the first node is in the OFF level. The size of the second transistor is larger than the sizes of the third and fourth transistors.

According to the scanning line drive circuit 20 according to the present embodiment, as with the first embodiment, a small-seized scanning line drive circuit having the function of switching the scanning direction and capable of preventing the malfunction can be provided. Furthermore, since the unit circuit 21 includes the second output reset transistor, the malfunction and the abnormal display in the liquid crystal display device 1 can be prevented more effectively.

Third Embodiment

Figure 15:
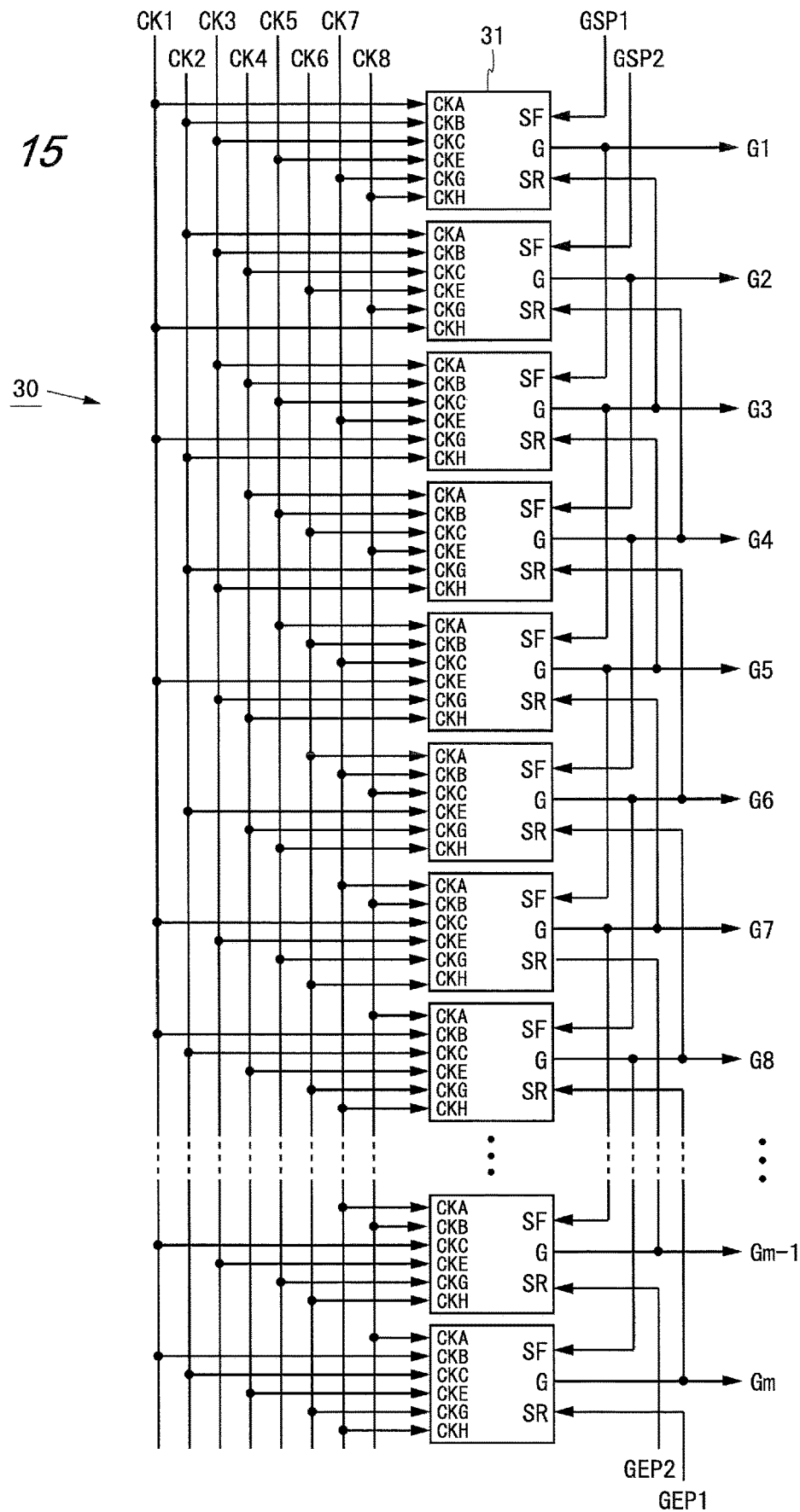
FIG. 15 is a block diagram showing a configuration of a scanning line drive circuit according to a third embodiment.

FIG. 15 is a block diagram showing a configuration of a scanning line drive circuit according to a third embodiment. A scanning line drive circuit 30 shown in FIG. 15 has a configuration in which m unit circuits 31 are connected in multi-stage, and is provided at the position of the scanning line drive circuit 10 of the liquid crystal display device 1 shown in FIG. 1. The configuration shown in FIG. 15 is an example of a case where m is a multiple of 8 and is not less than 16. The unit circuit 31 has clock terminals CKA, CKB, CKC, CKE, CKG, CKH, a forward direction scanning terminal SF, a backward direction scanning terminal SR, and the output terminal G. Eight phase clock signals CK1 to CK8, the gate start pulses GSP1, GSP2, and the gate end pulses GEP1, GEP2 are supplied to the scanning line drive circuit 30. The scanning line drive circuit 30 switches the scanning direction without using the control signals UD, UDB.

Clock signal CKa, CKb, CKc, CKe, CKg, CKh are respectively supplied to the clock terminals CKA, CKB, CKC, CKE, CKG, CKH of the unit circuit 31 in an i-th stage. Here, a=(i−1) mod 8+1, b=i mod 8+1, c=(i+1) mod 8+1, e=(i+3) mod 8+1, g=(i+5) mod 8+1, and h=(i+6) mod 8+1.

The gate start pulses GSP1, GSP2 are respectively supplied to the forward direction scanning terminals SF of the unit circuits 31 in a first stage and a second stage. An output signal G of the unit circuit 31 in a second previous stage is supplied to the forward direction scanning terminal SF of each of other unit circuits 31. The gate end pulses GEP2, GEP1 are respectively supplied to the backward direction scanning terminals SR of the unit circuit 31 in an (m−1)-th stage and an m-th stage. An output signal G of the unit circuit 31 in a second next stage is supplied to the backward direction scanning terminal SR of each of other unit circuits 31. An output signal G of the unit circuit 31 in the i-th stage is applied to the scanning line Gi.

Figure 16A:
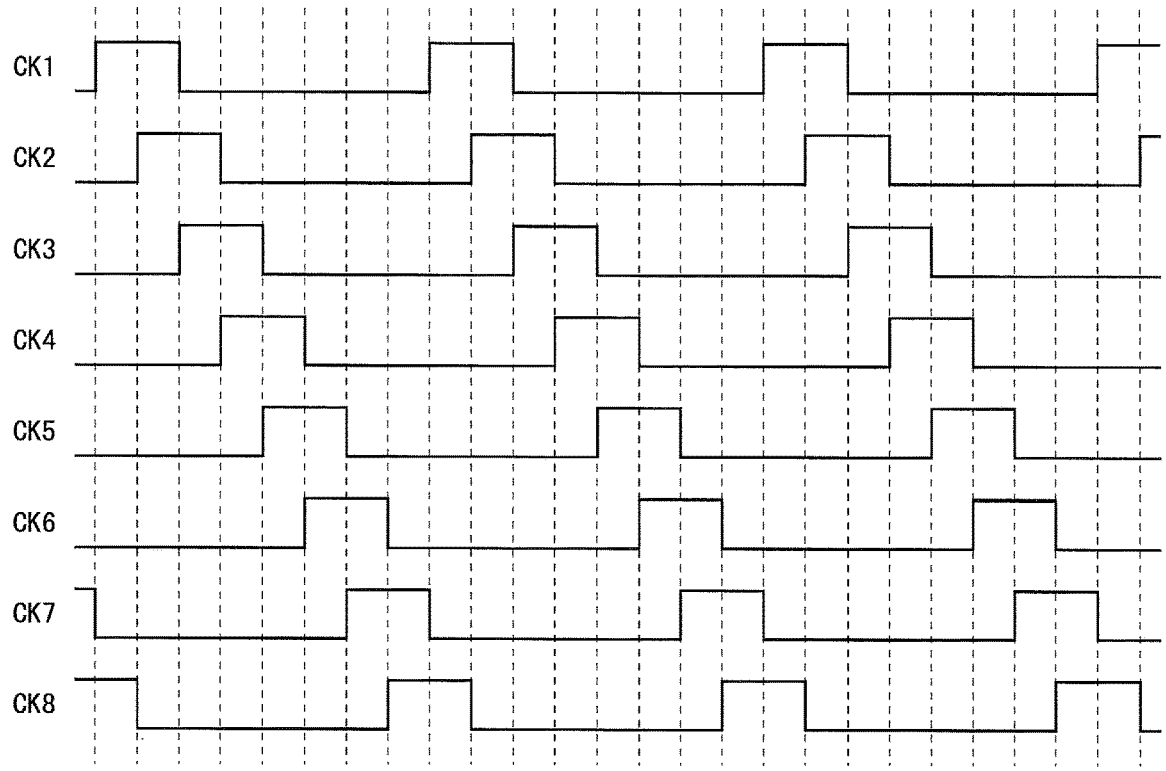
FIG. 16A is a diagram showing clock signals when the scanning line drive circuit shown in FIG. 15 performs the forward direction scanning.
Figure 16B:
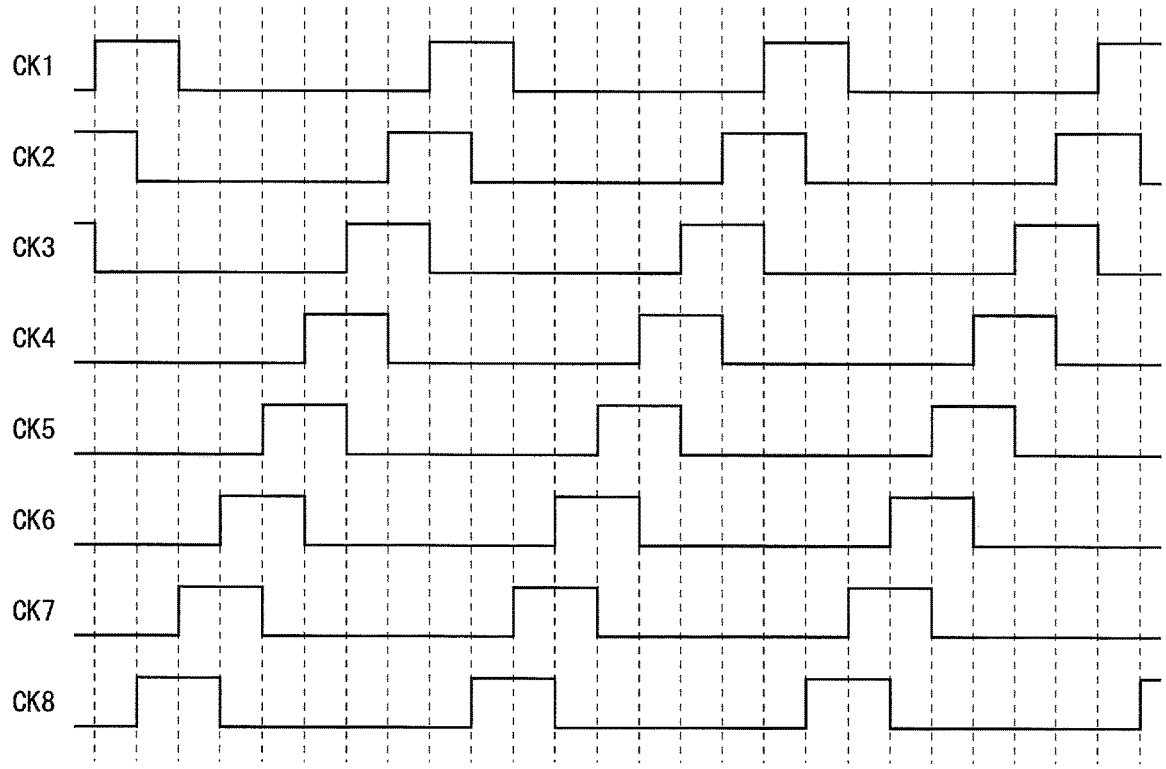
FIG. 16B is a diagram showing the clock signals when the scanning line drive circuit shown in FIG. 15 performs the backward direction scanning.

The clock signals CK1 to CK8 become the high level in ¼ cycle within one cycle, and become the low level in the remaining time. FIG. 16A is a diagram showing clock signals when the scanning line drive circuit 30 performs the forward direction scanning. In this case, the clock signals CK2 to CK5 are behind the clock signal CK1 by ⅛ cycle, ¼ cycle, ⅜ cycle, and half cycle, respectively. The clock signals CK6 to CK8 are ahead of the clock signal CK1 by ⅜ cycle, ¼ cycle, and ⅛ cycle, respectively. FIG. 16B is a diagram showing the clock signals when the scanning line drive circuit 30 performs the backward direction scanning. In this case, the clock signals CK2 to CK4 are ahead of the clock signal CK1 by ⅛ cycle, ¼ cycle, and ⅜ cycle, respectively. The clock signals CK5 to CK8 are behind the clock signal CK1 by half cycle, ⅜ cycle, ¼ cycle, and ⅛ cycle, respectively.

Figure 17:
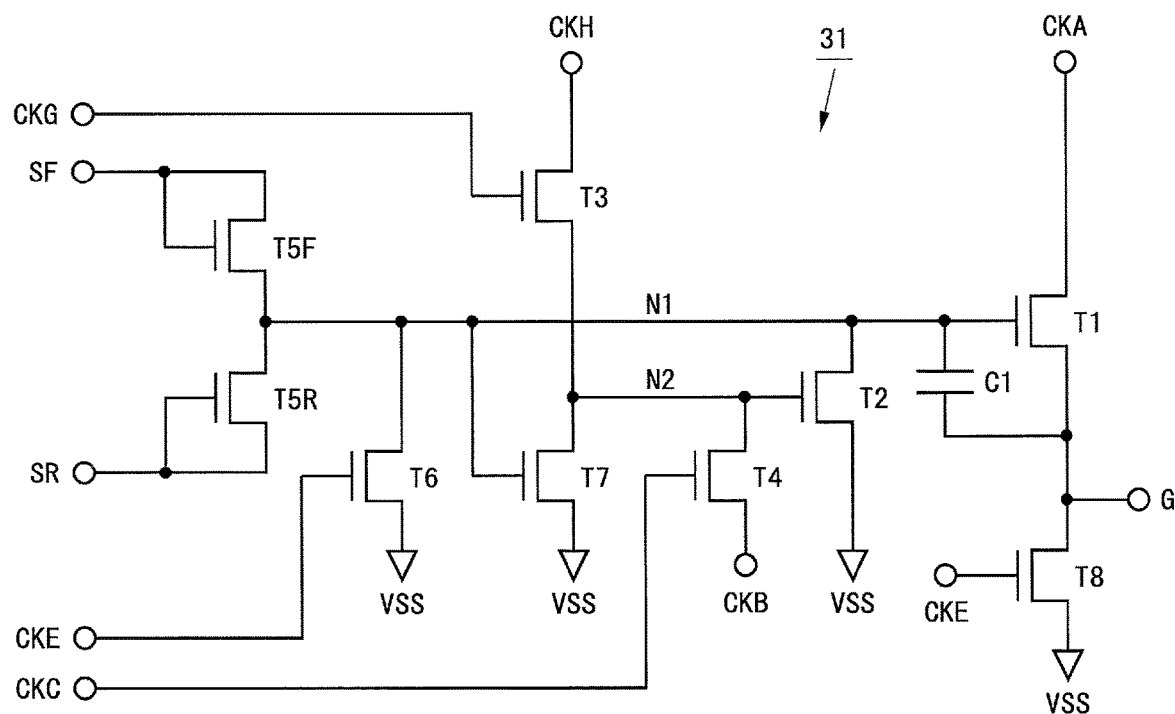
FIG. 17 is a circuit diagram of a unit circuit of the scanning line drive circuit shown in FIG. 15.

FIG. 17 is a circuit diagram of the unit circuit 31. The unit circuit 31 includes nine N-channel type TFTs T1 to T4, T5F, T5R, T6 to T8, and the capacitor C1. The unit circuit 31 is different from the unit circuit 11 according to the first embodiment in the following points. A drain terminal and a gate terminal of the TFT T5F are connected to the forward direction scanning terminal SF. A drain terminal and a gate terminal of the TFT T5R are connected to the backward direction scanning terminal SR. The gate terminal of the TFT T6 is connected to the clock terminal CKE, and the low-level voltage VSS is applied to the source terminal of the TFT T6. Source terminals of the TFTs T5F, T5R and the drain terminal of the TFT T6 are connected to the node N1. The drain terminal of the TFT T3 is connected to the clock terminal CKH, and the gate terminal of the TFT T3 is connected to the clock terminal CKG. The drain terminal of the TFT T4 is connected to the clock terminal CKB, and the gate terminal of the TFT T4 is connected to the clock terminal CKC. The gate terminal of the TFT T8 is connected to the clock terminal CKE. The size of the TFT T7 is sufficiently larger than the sizes of the TFTs T3, T4, also in the unit circuit 31. The TFTs T2 to T4, T7 function as a stabilization circuit for stabilizing the voltage of the gate terminal of the TFT T1.

Figure 18A:
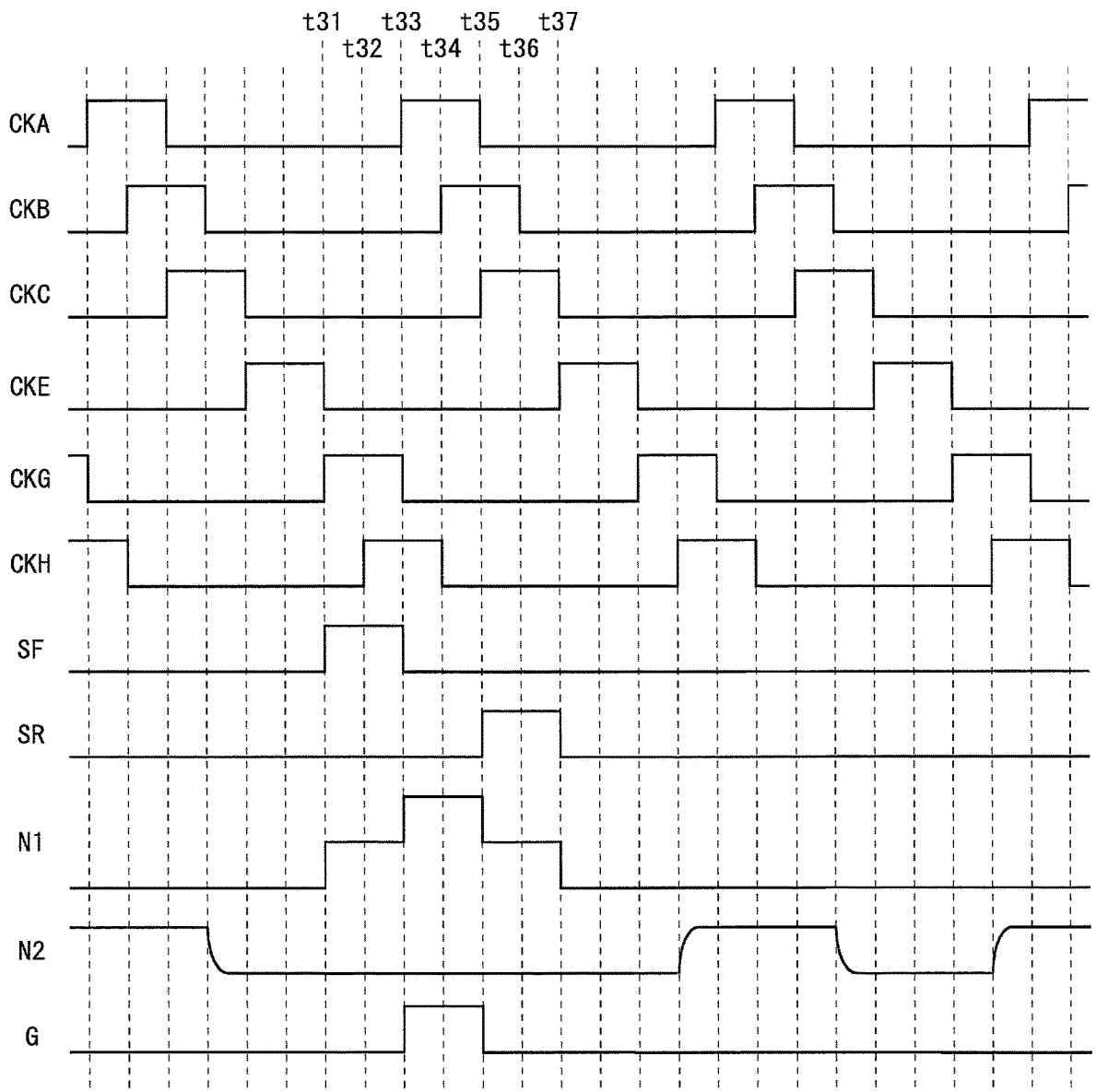
FIG. 18A is a timing chart when the scanning line drive circuit shown in FIG. 15 performs the forward direction scanning.

FIG. 18A is a timing chart when the scanning line drive circuit 30 performs the forward direction scanning. In the following, an operation of the unit circuit 31 when performing the forward direction scanning will be described with reference to FIG. 18A. Immediately before time t31, the clock signal CKE is in the high level, other clock signals, a forward direction scanning signal SF, a backward direction scanning signal SR, and the voltage of the nodes N1, N2 are in the low level, the TFTs T6, T8 are in the ON state, and other TFTs are in the OFF state.

At the time t31, the clock signal CKE is changed to the low level, and the clock signal CKG and the forward direction scanning signal SF are changed to the high level. Thus, the TFTs T3, T5F turn on and the TFTs T6, T8 turn off.

Accordingly, the voltage of the node N1 becomes the high level and the TFTs T1, T7 turn on. At time t32, the clock signal CKH is changed to the high level. As described above, the size of the TFT T7 is sufficiently larger than the size of the TFT T3. Therefore, the voltage of the node N2 is kept at the low level, even if the clock signal CKH is changed to the high level when the TFTs T3, T7 are in the ON state.

At time t33, the clock signal CKA is changed to the high level, and the clock signal CKG and the forward direction scanning signal SF are changed to the low level. Thus, the TFTs T3, T5F turn off. As with the first and second embodiments, the voltage of the node N1 becomes higher than the normal high level at this time. Therefore, the voltage of the output signal G becomes the same level as the high-level voltage of the clock signal CKA without falling by the threshold voltage of the TFT T1.

At time t34, the clock signal CKB is changed to the high level and the clock signal CKH is changed to the low level. At time t35, the clock signal CKA is changed to the low level, and the clock signal CKC and the backward direction scanning signal SR are changed to the high level. Thus, the TFT T4 turns on, the voltage of the node N1 becomes the normal high level, and the output signal G becomes the low level. As described above, the size of the TFT T7 is sufficiently larger than the size of the TFT T4. Therefore, the voltage of the node N2 is kept at the low level, even if the TFT T4 turns on when the TFT T7 is in the ON state and the clock signal CKB is in the high level. At time t36, the clock signal CKB is changed to the low level. At time t37, the clock signal CKC and the backward direction scanning signal SR are changed to the low level, and the clock signal CKE is changed to the high level. Thus, the TFTs T4, T5R turn off and the TFTs T6, T8 turn on.

After the time t37, the voltage of the node N2 becomes the high level when the clock signal CKH is changed to the high level, and becomes the low level when the clock signal CKB is changed to the low level. The voltage of the node N1 is kept at the low level until the forward direction scanning signal SF next becomes the high level. The output signal G is kept at the low level until the clock signal CKA becomes the high level after the forward direction scanning signal SF next becomes the high level. Also in the unit circuit 31, the voltage of the node N2 is changed to the high level and the low level while the voltage of the node N1 is in the low level.

Figure 18B:
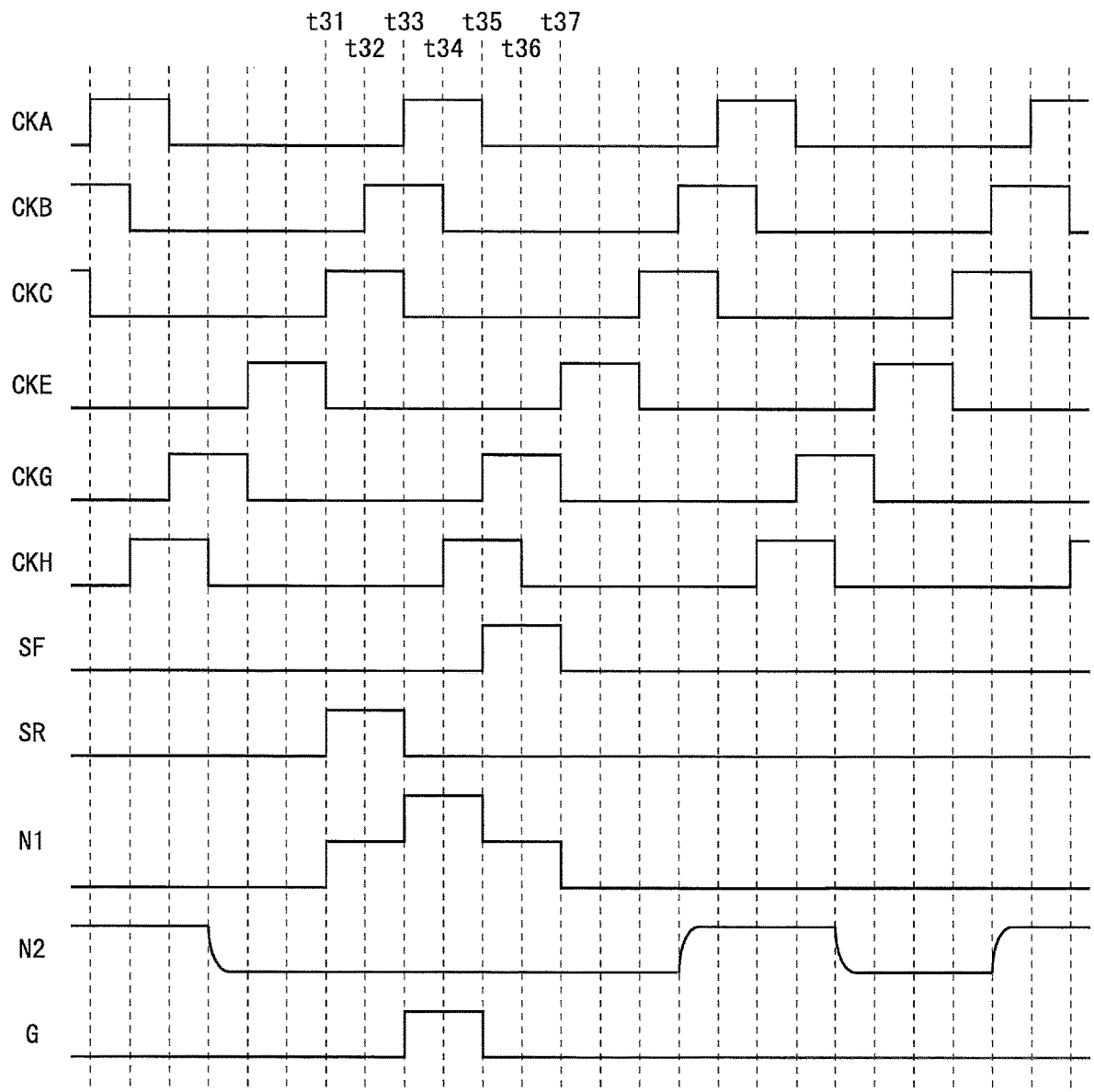
FIG. 18B is a timing chart when the scanning line drive circuit shown in FIG. 15 performs the backward direction scanning.

FIG. 18B is a timing chart when the scanning line drive circuit 30 performs the backward direction scanning. An operation of the unit circuit 31 in the backward direction scanning is same as the operation of the unit circuit 31 in the forward direction scanning when exchanging the clock signals CKB, CKC for the clock signals CKH, CKG, exchanging the forward direction scanning signal SF for the backward direction scanning signal SR, and exchanging the TFTs T3, T5F for the TFTs T4, T5R. As shown in FIGS. 18A and 18B, the voltage of the node N1 and the output signal G are changed in a same manner in the forward direction scanning and the backward direction scanning.

Figure 19:
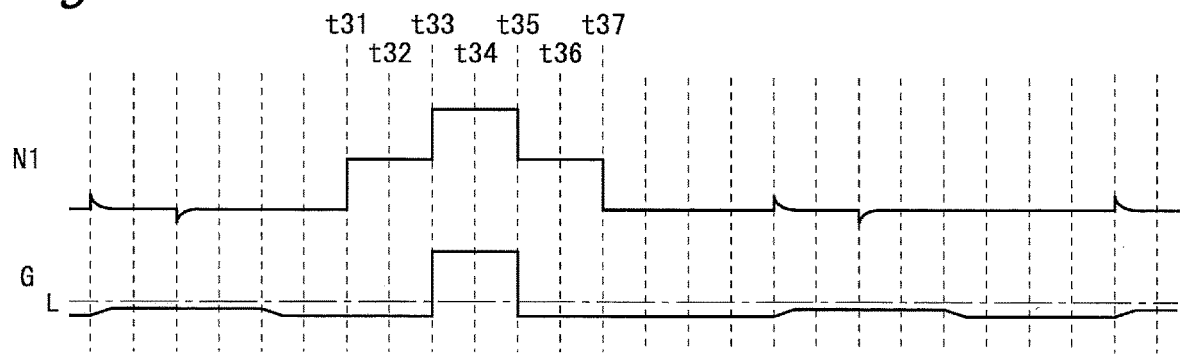
FIG. 19 is a diagram showing noise suppressed by the scanning line drive circuit shown in FIG. 15.

Also in the unit circuit 31, the parasitic capacitance Cx shown in FIG. 7 occurs between the drain terminal and the gate terminal of the TFT T1. Thus, if a scanning line drive circuit is designed without any special contrivance, noise shown in FIG. 19 is imposed on the voltage of the node N1 and the output signal G. According to the scanning line drive circuit 30, the noise shown in FIG. 19 can be suppressed.

When the scanning line drive circuit 30 performs the forward direction scanning, the voltage of the node N2 is changed to the high level when the clock signal CKH is changed to the high level. In this case, the clock signal CKH is ahead of the clock signal CKA by ⅛ cycle (see FIG. 18A). Therefore, at a time point when the clock signal CKA is changed to the high level, the voltage of the node N2 is already in the high level and the TFT T2 is already in the ON state.

When the scanning line drive circuit 30 performs the backward direction scanning, the voltage of the node N2 is changed to the high level when the clock signal CKB is changed to the high level. In this case, the clock signal CKB is ahead of the clock signal CKA by ⅛ cycle (see FIG. 18B). Therefore, at a time point when the clock signal CKA is changed to the high level, the voltage of the node N2 is already in the high level and the TFT T2 is already in the ON state.

In both cases, even if the voltage of the node N1 is increased when the clock signal CKA is changed to the high level, the voltage of the node N1 becomes the low level immediately by the action of the TFT T2. Therefore, it is possible to suppress the noise imposed on the voltage of the node N1 and the output signal G, and prevent the malfunction of the scanning line drive circuit 30 and the abnormal display in the liquid crystal display device 1. Furthermore, since the control signals UD, UDB are not used, it is possible to reduce a wiring area, reduce the frame size of the liquid crystal panel 2, and reduce a circuit for generating the control signals UD, UDB at an outside of the liquid crystal panel 2.

In the present embodiment, the clock signal CKH corresponds to a second clock signal being ahead of a first clock signal (clock signal CKA) by a first time (⅛ cycle) in the forward direction scanning, and being behind the first clock signal by the first time in the backward direction scanning. The clock signal CKB corresponds to a third clock signal being behind the first clock signal by the first time in the forward direction scanning, and being ahead of the first clock signal by the first time in the backward direction scanning. The clock signal CKG corresponds to a fourth clock signal being ahead of the first clock signal by a second time (¼ cycle) in the forward direction scanning, and being behind the first clock signal by the second time in the backward direction scanning. The clock signal CKC corresponds to a fifth clock signal being behind the first clock signal by the second time in the forward direction scanning, and being ahead of the first clock signal by the second time in the backward direction scanning. The clock signal CKE corresponds to a sixth clock signal being behind the first clock signal by half cycle.

As with the unit circuit 11 according to the first embodiment, the unit circuit 31 includes the output transistor and the first to fourth transistors. The unit circuit 31 is configured so that the voltage of the second node is changed to the ON level and the OFF level while the voltage of the first node is in the OFF level. The unit circuit 31 is configured so that the voltage of the second node is in the ON level when the first clock signal is changed to the ON level while the voltage of the first node is in the OFF level. The size of the second transistor is larger than the sizes of the third and fourth transistors.

The unit circuit 31 further includes a fifth transistor (TFT T5F) having a first conduction terminal (drain terminal) to which an output signal of the unit circuit in a front-side stage (unit circuit in second previous stage) is supplied, a second conduction terminal (source terminal) connected to the first node (node N1), and a control terminal (gate terminal) to which the output signal of the unit circuit in the front-side stage is supplied, a sixth transistor (TFT T5R) having a first conduction terminal to which an output signal of the unit circuit in a back-side stage (unit circuit in second next stage) is supplied, a second conduction terminal connected to the first node, and a control terminal to which the output signal of the unit circuit in the back-side stage is supplied, a reset transistor (TFT T6) having a first conduction terminal connected to the first node, a second conduction terminal to which the off-level voltage is applied, and a control terminal to which the sixth clock signal is supplied, and an output reset transistor (TFT T8) having a first conduction terminal connected to the output terminal G, a second conduction terminal to which the off-level voltage (low-level voltage) is applied, and a control terminal to which the sixth clock signal is supplied. The fifth transistor, the sixth transistor, and the reset transistor constitute a first node control circuit for controlling a voltage of the first node based on the output signal of the unit circuit in the front-side stage, the output signal of the unit circuit in the back-side stage, and the sixth clock signal.

According to the scanning line drive circuit 30 according to the present embodiment, as with the first and second embodiments, it is possible to provide a small-sized scanning line drive circuit having the function of switching the scanning direction and capable of preventing the malfunction. Furthermore, since the control signals UD, UDB are not used, it is possible to reduce the wiring area, reduce the frame size of the liquid crystal panel 2, and reduce the circuit for generating the control signals UD, UDB at the outside of the liquid crystal panel 2.

Fourth Embodiment

Figure 20:
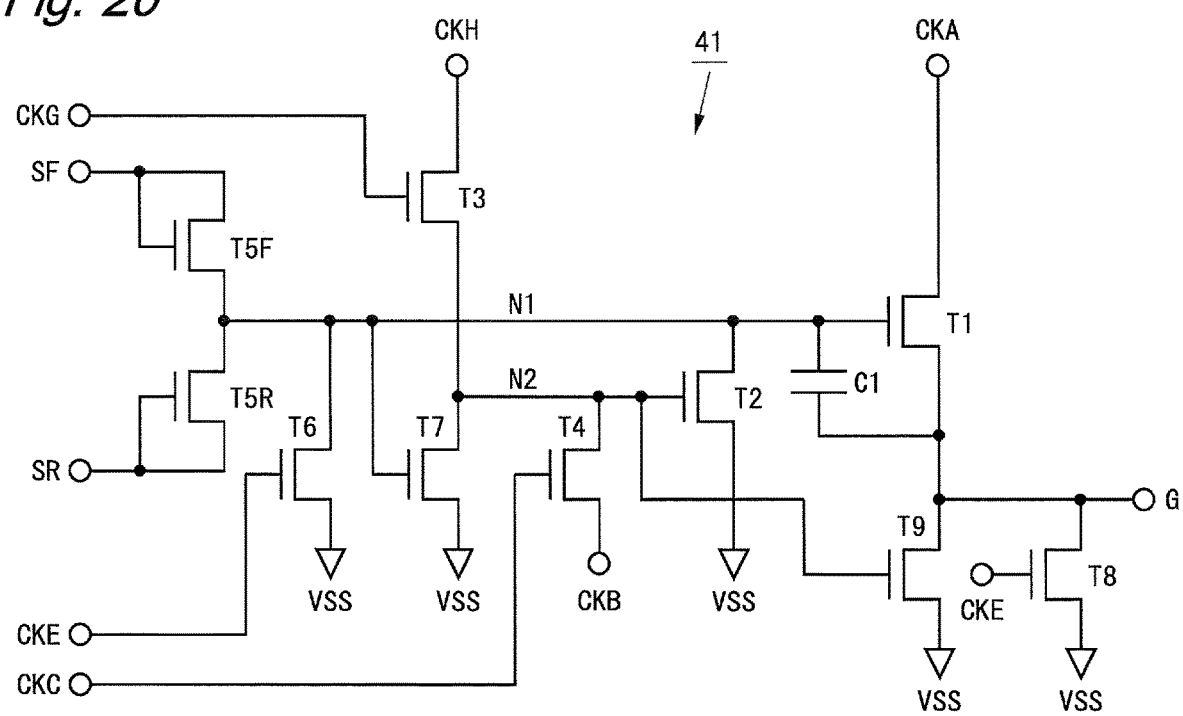
FIG. 20 is a circuit diagram of a unit circuit of a scanning line drive circuit according to a fourth embodiment.

A scanning line drive circuit according to a fourth embodiment has a configuration in which m unit circuits are connected in multi-stage, and is provided at the position of the scanning line drive circuit 10 of the liquid crystal display device 1 shown in FIG. 1. A connection form of the unit circuits is same as that in the third embodiment (see FIG. 15). FIG. 20 is a circuit diagram of the unit circuit of the scanning line drive circuit according to the present embodiment. A unit circuit 41 shown in FIG. 20 is obtained by adding the TFT T9 to the unit circuit 31 according to the third embodiment. The drain terminal of the TFT T9 is connected to the output terminal G, the low-level voltage VSS is applied to the source terminal of the TFT T9, and the gate terminal of the TFT T9 is connected to the node N2. The TFTs T2 to T4, T7 constitute a stabilization circuit for stabilizing the voltage of the gate terminal of the TFT T1.

When the scanning line drive circuit according to the present embodiment performs the forward direction scanning, the clock signals CK1 to CK8 are changed as shown in FIG. 16A. In this case, the unit circuit 41 operates in accordance with the timing chart shown in FIG. 18A. When the scanning line drive circuit according to the present embodiment performs the backward direction scanning, the clock signals CK1 to CK8 are changed as shown in FIG. 16B. In this case, the unit circuit 41 operates in accordance with the timing chart shown in FIG. 18B.

In both cases, at a time point when the clock signal CKA is changed to the high level, the voltage of the node N2 is already in the high level and the TFTs T2, T9 are already in the ON state. Thus, even if the voltage of the node N1 is once increased when the clock signal CKA is changed to the high level, the voltage of the node N1 becomes the low level immediately by the action of the TFT T2. The output signal G is fixed to the low level by the action of the TFT T9 at this time. Therefore, according to the scanning line drive circuit according to the present embodiment, it is possible to prevent the malfunction and the abnormal display in the liquid crystal display device 1 more effectively than the scanning line drive circuit 30 according to the third embodiment.

The unit circuit 41 includes components of the unit circuit 31, and a second output reset transistor (TFT T9) having a first conduction terminal (drain terminal) connected to the output terminal G, a second conduction terminal (source terminal) to which the off-level voltage (low-level voltage) is applied, and a control terminal (gate terminal) connected to the second node (node N2). According to the scanning line drive circuit according to the present embodiment, it is possible to prevent the malfunction and the abnormal display in the liquid crystal display device 1 more effectively than the scanning line drive circuit 30 according to the third embodiment.

Figure 21:
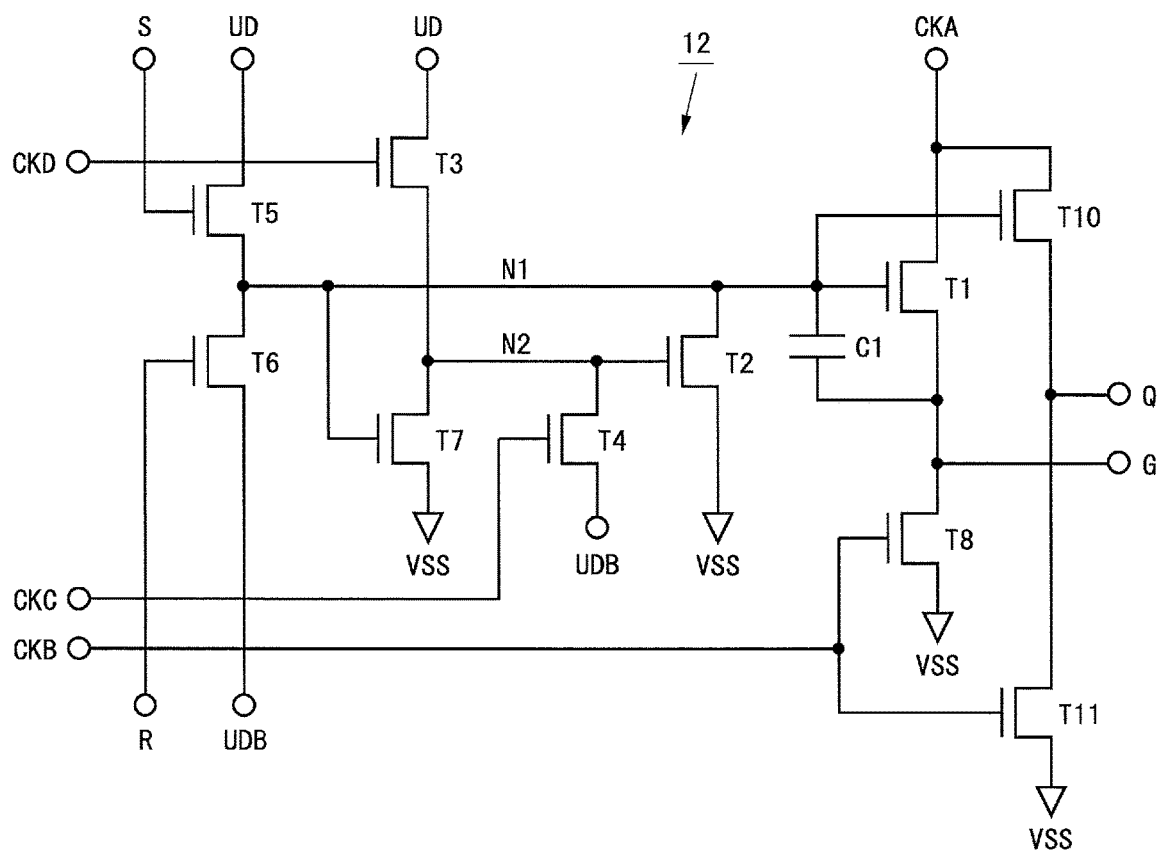
FIG. 21 is a circuit diagram of a unit circuit of a scanning line drive circuit according to a variant.

Various kinds of variants can be configured for the scanning line drive circuits and the liquid crystal display devices described above. For example, a scanning line drive circuit according to a variant may be configured by connecting unit circuits each having two output terminals, in multi-stage. FIG. 21 is a circuit diagram of a unit circuit of the scanning line drive circuit according to a variant. A unit circuit 12 shown in FIG. 21 is obtained by adding an output terminal Q and TFTs T10, T11 to the unit circuit 11 (FIG. 5) according to the first embodiment. A drain terminal of the TFT T10 is connected to the clock terminal CKA, and a gate terminal of the TFT T10 is connected to the gate terminal of the TFT T1. A source terminal of the TFT T10 and a drain terminal of the TFT T11 are connected to the output terminal Q. A gate terminal of the TFT T11 is connected to the clock terminal CKB, and the low-level voltage VSS is applied to a source terminal of the TFT T11. The TFTs T10, T11 respectively perform switching at a same timing in a same direction as the TFTs T1, T8. An output signal Q is changed at a same timing in a same direction as the output signal G.

In the scanning line drive circuit according to the variant, an output signal G of the unit circuit 12 in an i-th stage is applied to the scanning line Gi. In place of an output signal G of the unit circuit 12 in a second previous stage, an output signal Q of the unit circuit 12 in the second previous stage is supplied to the set terminal S of the unit circuit 12 in a stage other than a first stage and a second stage. In place of an output signal G of the unit circuit 12 in a second next stage, an output signal Q of the unit circuit 12 in the second next stage is supplied to the reset terminal R of the unit circuit 12 in a stage other than an (m−1)-th stage and an m-th stage. According to the scanning line drive circuit according to the variant, it is possible to attain same effects as the scanning line drive circuit 10 according to the first embodiment. In a similar manner, a scanning line drive circuit according to a variant may be configured using a unit circuit obtained by adding the output terminal Q and the TFTs T10, T11 to any of the unit circuits 21, 31, 41 according to the second to fourth embodiments.

Figure 22:
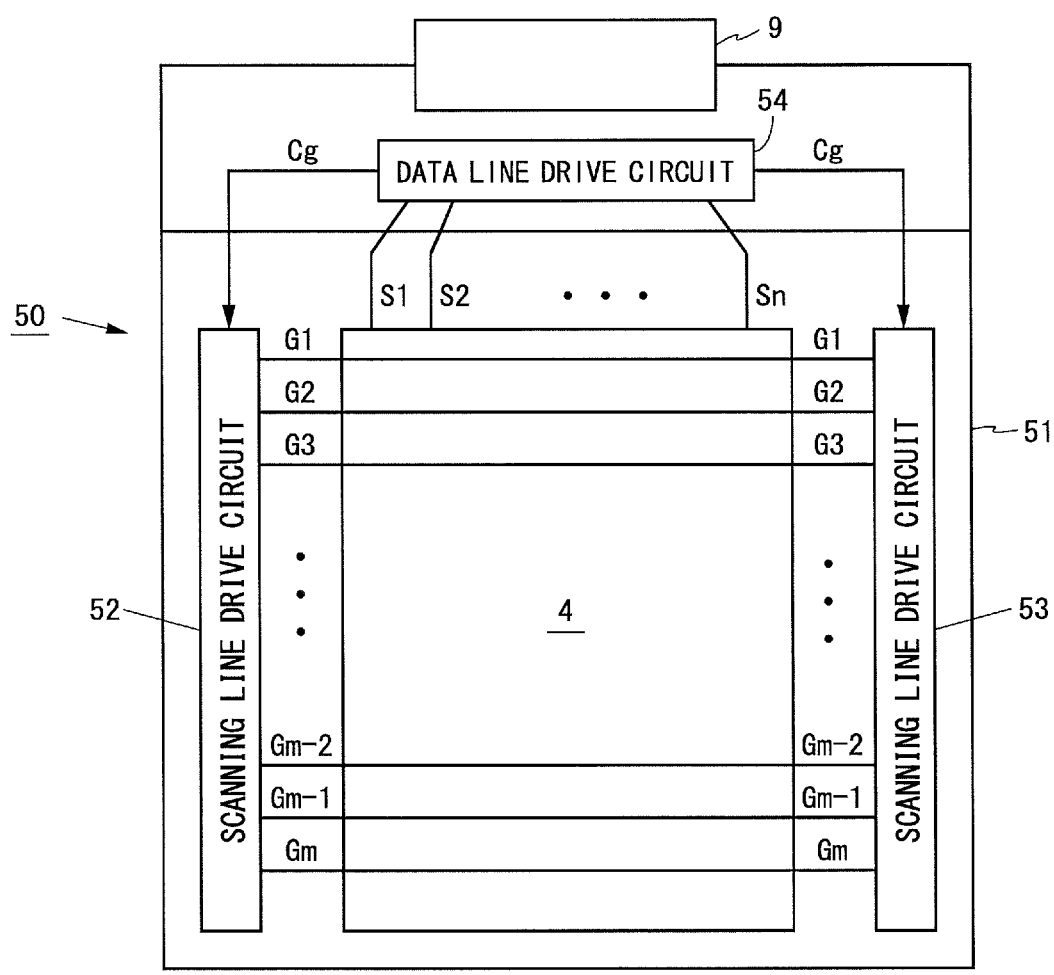
FIG. 22 is a block diagram showing a configuration of a liquid crystal display device including a scanning line drive circuit according one of embodiments and variants.
Figure 23:
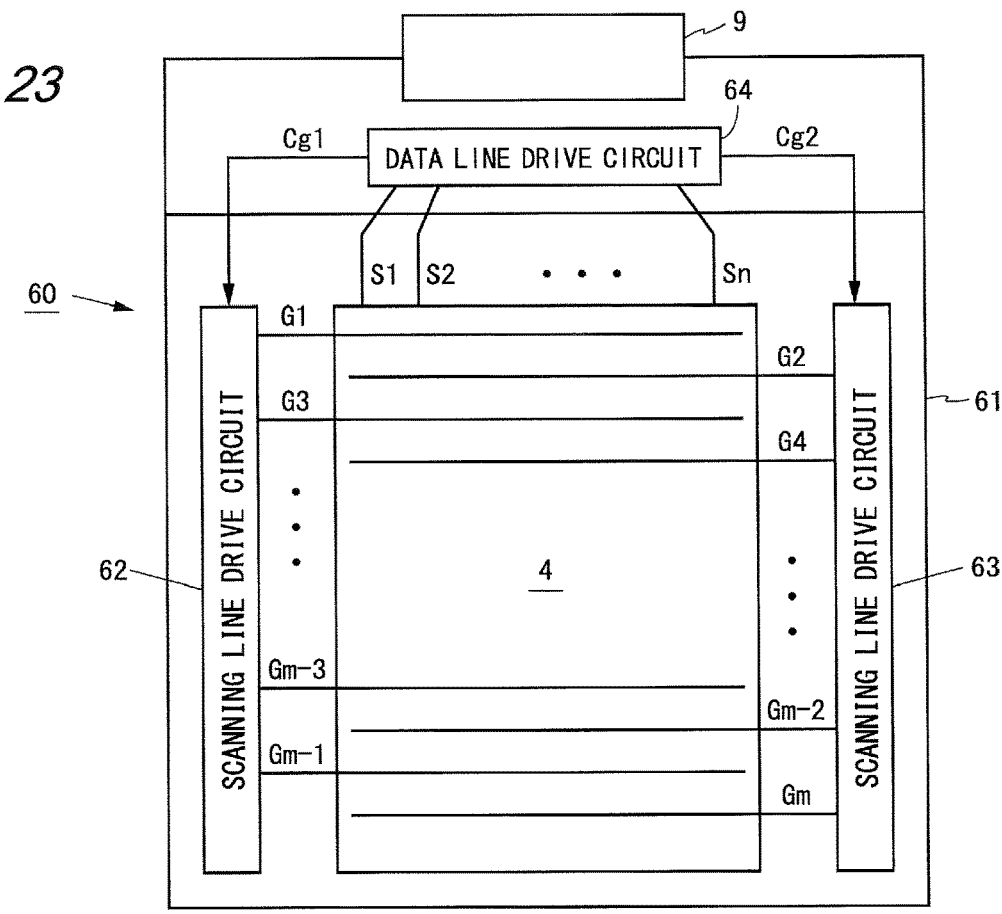
FIG. 23 is a block diagram showing a configuration of a liquid crystal display device including the scanning line drive circuit according to one of the embodiments and the variants.
Figure 24:
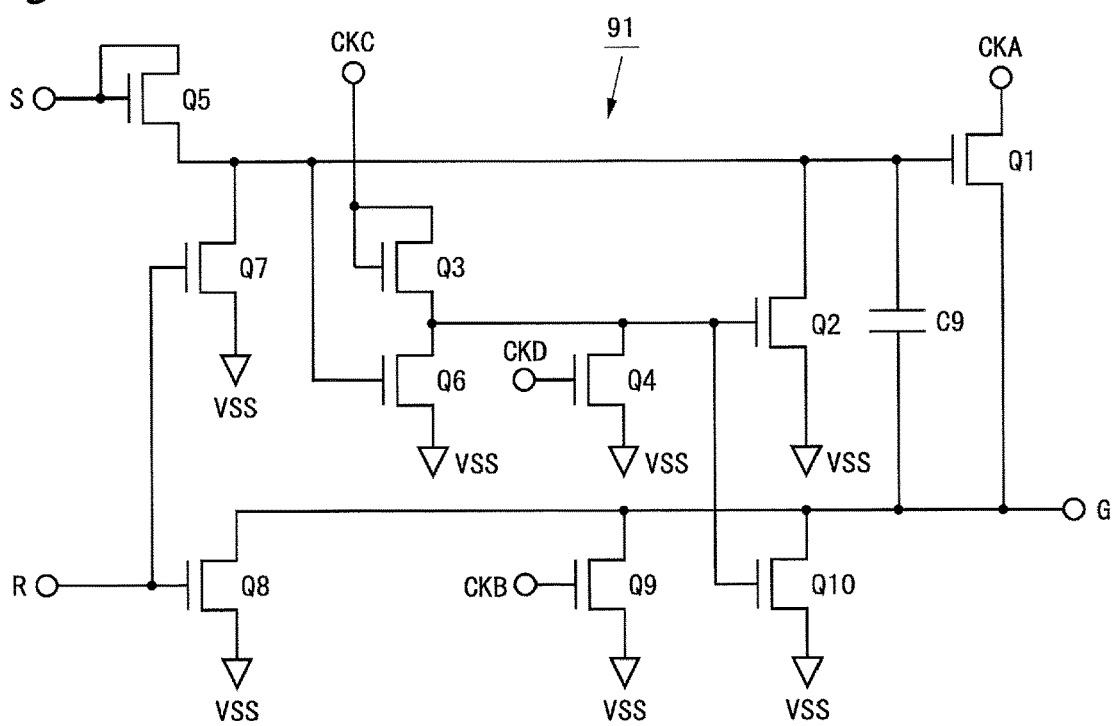
FIG. 24 is a circuit diagram of a unit circuit of a conventional scanning line drive circuit.

Furthermore, a liquid crystal display device having a scanning line drive circuit may have a configuration shown in FIGS. 22 and 23. The scanning line drive circuits shown in FIGS. 22 and 23 are monolithically formed on a liquid crystal panel using a same manufacturing process as that of the TFT (not shown) in the pixel circuit.

A liquid crystal display device 50 shown in FIG. 22 includes a liquid crystal panel 51, two scanning line drive circuits 52, 53, and a data line drive circuit 54. The scanning line drive circuits 52, 53 are respectively arranged along with two sides (left side and right side in FIG. 22) parallel to the data lines S1 to Sn among sides of the display area 4. One ends (left ends in FIG. 22) of the scanning lines G1 to Gm are connected to the scanning line drive circuit 52, and the other ends of the scanning lines G1 to Gm are connected to the scanning line drive circuit 53. The scanning line drive circuit 52 drives the scanning lines G1 to Gm from the left ends in accordance with a control signal Cg supplied from the data line drive circuit 54. The scanning line drive circuit 53 drives the scanning lines G1 to Gm from the right ends in accordance with the control signal Cg supplied from the data line drive circuit 54. In the liquid crystal display device 50, the scanning lines G1 to Gm are driven from both ends using the scanning line drive circuits 52, 53.

A liquid crystal display device 60 shown in FIG. 23 includes a liquid crystal panel 61, two scanning line drive circuits 62, 63, and a data line drive circuit 64. The scanning line drive circuits 62, 63 are arranged in same positions as the scanning line drive circuits 52, 53, respectively. One ends (left ends in FIG. 23) of odd-numbered scanning lines G1, G3, . . . , Gm−1 are connected to the scanning line drive circuit 62, and one ends (right ends in FIG. 23) of even-numbered scanning lines G2, G4, . . . , Gm are connected to the scanning line drive circuit 63. The scanning line drive circuit 62 drives the odd-numbered scanning lines G1, G3, . . . , Gm−1 from the left ends in accordance with a control signal Cg1 supplied from the data line drive circuit 64. The scanning line drive circuit 63 drives the even-numbered scanning lines G2, G4, . . . , Gm from the right ends in accordance with a control signal Cg2 supplied from the data line drive circuit 64. In the liquid crystal display device 60, the scanning lines G1 to Gm are driven alternately using the scanning line drive circuits 62, 63.

Furthermore, a unit circuit of a scanning line drive circuit may be configured by P-channel type TFTs. As a semiconductor layer of the TFT included in the unit circuit, amorphous silicon, oxide semiconductor, indium gallium zinc oxide (IGZO), low temperature polysilicon (LTPS) or low temperature polycrystalline oxide (LTPO) may be used, for example. Furthermore, a display device other than a liquid crystal display device may be configured using a method similar to the above-described method.

Although the present invention is described in detail in the above, the above description is exemplary in all of the aspects and is not restrictive. It is understood that various other changes and modification can be derived without going out of the prevent invention.

This application claims a priority based on Japanese Patent Application No. 2017-218854 filed on Nov. 14, 2017, and entitled "Scanning Line Drive Circuit And Display Device Including The Same", which is incorporated herein by reference in its entirety.

What is claimed is:

1. A scanning line drive circuit configured by connecting a plurality of unit circuits in multi-stage, and having a function of switching a scanning direction, wherein
the unit circuit includes:
an output transistor having a first conduction terminal to which a first clock signal is supplied, a second conduction terminal connected to an output terminal, and a control terminal connected to a first node;
a first transistor having a first conduction terminal connected to the first node, a second conduction terminal to which an off-level voltage is applied, and a control terminal connected to a second node;
a second transistor having a first conduction terminal connected to the second node, a second conduction terminal to which the off-level voltage is applied, and a control terminal connected to the first node;
a third transistor configured to apply an on-level voltage to the second node based on a second clock signal being ahead of the first clock signal in a forward direction scanning;
a fourth transistor configured to apply the on-level voltage to the second node based on a third clock signal being ahead of the first clock signal in a backward direction scanning; and
a first node control circuit configured to control a voltage of the first node based on an output signal of the unit circuit in a front-side stage and an output signal of the unit circuit in a back-side stage,
a voltage of the second node is changed to an ON level and an OFF level while the voltage of the first node is in the OFF level, and
the voltage of the second node is in the ON level when the first clock signal is changed to the ON level while the voltage of the first node is in the OFF level.

2. The scanning line drive circuit according to claim 1, wherein
the third transistor has a first conduction terminal to which a first control signal being the ON level in the forward direction scanning and being the OFF level in the backward direction scanning is supplied, a second conduction terminal connected to the second node, and a control terminal to which the second clock signal is supplied,
the fourth transistor has a first conduction terminal to which a second control signal being the OFF level in the forward direction scanning and being the ON level in the backward direction scanning is supplied, a second conduction terminal connected to the second node, and a control terminal to which the third clock signal is supplied,
the second clock signal is ahead of the first clock signal by a first time in the forward direction scanning, and is behind the first clock signal by the first time in the backward direction scanning, and
the third clock signal is behind the first clock signal by the first time in the forward direction scanning, and is ahead of the first clock signal by the first time in the backward direction scanning.

3. The scanning line drive circuit according to claim 2, wherein a size of the second transistor is larger than sizes of the third and fourth transistors.

4. The scanning line drive circuit according to claim 2, wherein the first to third clock signals become the ON level in a time not shorter than ¼ cycle and shorter than half cycle within one cycle, and the first time is ¼ cycle.

5. The scanning line drive circuit according to claim 2, wherein the first to third clock signals become the ON level in ⅔ cycle within one cycle, and the first time is ⅓ cycle.

6. The scanning line drive circuit according to claim 2, wherein the unit circuit further includes an output reset transistor having a first conduction terminal connected to the output terminal, a second conduction terminal to which the off-level voltage is applied, and a control terminal to which a fourth clock signal being behind the first clock signal by half cycle is supplied.

7. The scanning line drive circuit according to claim 2, wherein the unit circuit further includes a second output reset transistor having a first conduction terminal connected to the output terminal, a second conduction terminal to which the off-level voltage is applied, and a control terminal connected to the second node.

8. The scanning line drive circuit according to claim 2, wherein
the first node control circuit includes:
a fifth transistor having a first conduction terminal to which the first control signal is supplied, a second conduction terminal connected to the first node, and a control terminal to which the output signal of the unit circuit in the front-side stage is supplied; and
a sixth transistor having a first conduction terminal to which the second control signal is supplied, a second conduction terminal connected to the first node, and a control terminal to which the output signal of the unit circuit in the back-side stage is supplied.

9. The scanning line drive circuit according to claim 8, wherein the unit circuit in the front-side stage is the unit circuit in a second previous stage, and the unit circuit in the back-side stage is the unit circuit in a second next stage.

10. The scanning line drive circuit according to claim 8, wherein the unit circuit in the front-side stage is the unit circuit in a third previous stage, and the unit circuit in the back-side stage is the unit circuit in a third next stage.

11. The scanning line drive circuit according to claim 1, wherein
the third transistor has a first conduction terminal to which the second clock signal is supplied, a second conduction terminal connected to the second node, and a control terminal to which a fourth clock signal is supplied,
the fourth transistor has a first conduction terminal to which the third clock signal is supplied, a second conduction terminal connected to the second node, and a control terminal to which a fifth clock signal is supplied,
the second clock signal is ahead of the first clock signal by a first time in the forward direction scanning, and is behind the first clock signal by the first time in the backward direction scanning,
the third clock signal is behind the first clock signal by the first time in the forward direction scanning, and is ahead of the first clock signal by the first time in the backward direction scanning,
the fourth clock signal is ahead of the first clock signal by a second time in the forward direction scanning, and is behind the first clock signal by the second time in the backward direction scanning,
the fifth clock signal is behind the first clock signal by the second time in the forward direction scanning, and is ahead of the first clock signal by the second time in the backward direction scanning, and
the second time is longer than the first time.

12. The scanning line drive circuit according to claim 11, wherein a size of the second transistor is larger than sizes of the third and fourth transistors.

13. The scanning line drive circuit according to claim 11, wherein the first to fifth clock signals become the ON level in ¼ cycle within one cycle, the first time is ⅛ cycle, and the second time is ¼ cycle.

14. The scanning line drive circuit according to claim 11, wherein
the first node control circuit includes:
a fifth transistor having a first conduction terminal to which the output signal of the unit circuit in the front-side stage is supplied, a second conduction terminal connected to the first node, and a control terminal to which the output signal of the unit circuit in the front-side stage is supplied;
a sixth transistor having a first conduction terminal to which the output signal of the unit circuit in the back-side stage is supplied, a second conduction terminal connected to the first node, and a control terminal to which the output signal of the unit circuit in the back-side stage is supplied; and
a reset transistor having a first conduction terminal connected to the first node, a second conduction terminal to which the off-level voltage is applied, and a control terminal to which a sixth clock signal being behind the first clock signal by half cycle is supplied.

15. The scanning line drive circuit according to claim 14, wherein the unit circuit in the front-side stage is the unit circuit in a second previous stage, and the unit circuit in the back-side stage is the unit circuit in a second next stage.

16. The scanning line drive circuit according to claim 11, wherein the unit circuit further includes an output reset transistor having a first conduction terminal connected to the output terminal, a second conduction terminal to which the off-level voltage is applied, and a control terminal to which a sixth clock signal being behind the first clock signal by half cycle is supplied.

17. The scanning line drive circuit according to claim 11, wherein the unit circuit further includes a second output reset transistor having a first conduction terminal connected to the output terminal, a second conduction terminal to which the off-level voltage is applied, and a control terminal connected to the second node.

18. A display device comprising:
a plurality of scanning lines arranged in parallel with each other;
a plurality of data lines arranged in parallel with each other so as to intersect with the scanning lines perpendicularly;
a plurality of pixel circuits arranged corresponding to intersections of the scanning lines and the data lines; and
the scanning line drive circuit according to claim 1.

19. The display device according to claim 18, wherein the scanning line drive circuit is monolithically formed on a display panel including the pixel circuits.

20. The display device according to claim 19, wherein the display panel is a liquid crystal panel.

* * * * *